(12) United States Patent
Fukagawa et al.

(10) Patent No.: US 12,341,249 B2
(45) Date of Patent: Jun. 24, 2025

(54) RADIO WAVE ABSORBER AND RADIO WAVE ABSORBING ARTICLE

(71) Applicant: FUJIFILM Corporation, Tokyo (JP)

(72) Inventors: Kiyotaka Fukagawa, Minamiashigara (JP); Hirokazu Hashimoto, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 379 days.

(21) Appl. No.: 18/145,384

(22) Filed: Dec. 22, 2022

(65) Prior Publication Data

US 2023/0139287 A1    May 4, 2023

Related U.S. Application Data

(63) Continuation of application No. PCT/JP2021/022033, filed on Jun. 10, 2021.

(30) Foreign Application Priority Data

Jun. 29, 2020  (JP) ................. 2020-111740
Dec. 21, 2020  (JP) ................. 2020-211435

(51) Int. Cl.
*H01Q 17/00* (2006.01)
*C08K 3/22* (2006.01)
*H01F 1/34* (2006.01)

(52) U.S. Cl.
CPC ............. *H01Q 17/004* (2013.01); *C08K 3/22* (2013.01); *H01F 1/348* (2013.01); *C08K 2003/2265* (2013.01); *C08K 2201/01* (2013.01)

(58) Field of Classification Search
CPC ............ H01Q 17/004; C08K 3/22; C08K 2003/2265; C08K 2201/01; H01F 1/348; H01F 1/344; H05K 9/0075; C01G 49/0045
See application file for complete search history.

(56) References Cited

U.S. PATENT DOCUMENTS

| | | | |
|---|---|---|---|
| 5,004,561 A | | 4/1991 | Nomura et al. |
| 2004/0094742 A1* | | 5/2004 | Kawano .......... H01F 1/083 |
| | | | 252/62.55 |
| 2021/0012936 A1 | | 1/2021 | Ohkoshi et al. |
| 2021/0166850 A1 | | 6/2021 | Hashimoto |
| 2021/0179442 A1* | | 6/2021 | Chen ............... H01F 41/0246 |

FOREIGN PATENT DOCUMENTS

| | | | |
|---|---|---|---|
| JP | 2002-164689 A | | 6/2002 |
| JP | 2005179185 A | * | 7/2005 |
| JP | 2007-250823 A | | 9/2007 |
| JP | 2010-77198 A | | 4/2010 |
| JP | 2019-145534 A | | 8/2019 |
| WO | 2012/023672 A1 | | 2/2012 |
| WO | 2020/044649 A1 | | 3/2020 |

OTHER PUBLICATIONS

18145384_2025-02-28_JP_2005179185_A_M.pdf, machine translation of JP-2005179185-A (Year: 2005).*
International Search Report dated Aug. 24, 2021, issued in International Application No. PCT/JP2021/022033.
Written Opinion dated Aug. 24, 2021, issued in International Application No. PCT/JP2021/022033.
International Preliminary Report on Patentability (with translation of Written Opinion) dated Dec. 13, 2022, issued in International Application No. PCT/JP2021/022033.
Extended European Search Report dated Nov. 20, 2023 in European Application No. 21831790.7.
Jai-Chong Ho, et al., "Induced γ→α Crystal Transformation in Blends of Polyamide 6 and Liquid Crystalline Copolyester", Macromolecules, 2000, vol. 33, No. 14, pp. 5181-5186 (6 pages).
Office Action dated May 13, 2024 in Korean Application No. 10-2022-7044477.
Jia-Chong HO et al., "Induced y -> a Crystal Transformation in Blends of Polyamide 6 and Liquid Crystalline Copolyester", Macromolecules, 2000, vol. 33, pp. 5181-5186 (6 pages total).
Office Action issued Jan. 23, 2025 in Korean Patent Application No. 10-2022-7044477.

* cited by examiner

*Primary Examiner* — Timothy A Brainard
*Assistant Examiner* — Kenneth W Good
(74) *Attorney, Agent, or Firm* — Sughrue Mion, PLLC

(57) ABSTRACT

There is provided a radio wave absorber containing a magnetic powder, and an aliphatic polyamide, in which an intensity ratio ($\alpha/\gamma$) of a diffraction intensity $\alpha$ of an $\alpha$ crystal of the aliphatic polyamide to a diffraction intensity $\gamma$ of a $\gamma$ crystal of the aliphatic polyamide, which are determined by subjecting the radio wave absorber to measurement with an X-ray diffraction method, is 2.60 or less. There is also provided a radio wave absorbing article including this radio wave absorber.

20 Claims, No Drawings

RADIO WAVE ABSORBER AND RADIO WAVE ABSORBING ARTICLE

CROSS-REFERENCE TO RELATED APPLICATIONS

This application is a Continuation of PCT International Application No. PCT/JP2021/022033 filed on Jun. 10, 2011, which claims priority under 35 U.S.C. § 119(a) to Japanese Patent Application No. 2020-111740 filed on Jun. 29, 2020 and Japanese Patent Application No. 2020-211435 filed on Dec. 21, 2020. Each of the above applications is hereby expressly incorporated by reference, in its entirety, into the present application.

BACKGROUND OF THE INVENTION

1. Field of the Invention

The present invention relates to a radio wave absorber and a radio wave absorbing article.

2. Description of the Related Art

A radio wave absorber containing a magnetic powder as a radio wave absorbing material is known. In addition, examples of the radio wave absorber containing a magnetic powder include a radio wave absorber containing a magnetic powder and a binder (see JP2010-77198A).

CITATION LIST

Patent Literature

PTL1: JP2010-77198A

SUMMARY OF THE INVENTION

In recent years, as an electronic device that uses radio waves, a radar for recognizing an object by transmitting and receiving radio waves has attracted attention. For example, an on-vehicle radar transmits radio waves and receives the radio waves reflected by an object (such as a pedestrian, a vehicle, or the like), whereby it can recognize the presence of the object, the distance to the object, or the like. In order to prevent collision with an object, as necessary, an automatic driving control system of an automobile can automatically brake and stop the automobile or can automatically control the speed to keep a distance to the object based on the results obtained from the radar by recognizing the object.

In order to improve the reliability of the system that carries out various controls based on the results obtained from the radar by recognizing the object as described above, it is desired to improve the performance of the radar. For this reason, in recent years, it has begun to be examined to install a radio wave absorber on a front side (an incident side of a radio wave incident from the outside) of a radio wave transmitting and receiving unit of a radar to improve the recognition accuracy.

Examples of the indicator of the radio wave absorber performance include transmission attenuation characteristics. From the viewpoint of improving the recognition accuracy of the radar, it is desirable to use a radio wave absorber having an absorption peak of transmission attenuation at a frequency to be absorbed. In addition, also in various other use applications in which a radio wave absorber is used, a radio wave absorber having an absorption peak of transmission attenuation at a frequency to be absorbed is desirable. In this regard, in the related art, it has been conceived that the transmission attenuation characteristics of the radio wave absorber containing a magnetic powder and a binder can be controlled with the kind of the magnetic powder.

By the way, regarding the binder, JP2010-77198A mainly describes a fluororesin (see paragraph 0016 of JP2010-77198A). In response to this, the inventors of the present invention repeatedly studied the use of the aliphatic polyamide, which is said to be a resin excellent in hardness and the like. As a result, it was revealed that regarding the radio wave absorber containing a magnetic powder and an aliphatic polyamide, a phenomenon that has not been known in the related art occurs, that is, a phenomenon that the position of the absorption peak of transmission attenuation may change (that is, the position of the absorption peak of transmission attenuation deviates) even in a case of radio wave absorbers containing the same kind of magnetic powder. Such a phenomenon makes it difficult to control the transmission attenuation characteristics of the radio wave absorber.

In consideration of the above circumstances, one aspect of the present invention is to provide a radio wave absorber containing a magnetic powder and an aliphatic polyamide, where the occurrence of the deviation in the position of the absorption peak of transmission attenuation is suppressed in the radio wave absorber.

One aspect of the present invention relates to a radio wave absorber containing a magnetic powder, and an aliphatic polyamide, in which an intensity ratio ($\alpha/\gamma$) of a diffraction intensity $\alpha$ of an $\alpha$ crystal of the aliphatic polyamide to a diffraction intensity $\gamma$ of a $\gamma$ crystal of the aliphatic polyamide, which are determined by subjecting the radio wave absorber to measurement with an X-ray diffraction method, is 2.60 or less.

In one form, the magnetic powder can contain a powder of a hexagonal ferrite.

In one form, the hexagonal ferrite can have a composition represented by Formula 1.

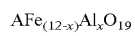

$$AFe_{(12-x)}Al_xO_{19} \qquad \text{Formula 1}$$

(In Formula 1, A represents one or more kinds of atoms selected from the group consisting of Sr, Ba, Ca, and Pb, and x satisfies $0.50 \leq x \leq 8.00$.)

In one form, the atom represented by A can include Sr.

In one form, in Formula 1, x can satisfy $1.50 \leq x \leq 8.00$.

In one form, in Formula 1, x can satisfy $0.50 \leq x < 1.50$.

In one form, the magnetic powder can contain a powder of an $\epsilon$-iron oxide.

In one form, the $\epsilon$-iron oxide can be an $\epsilon$-iron oxide containing one or more kinds of atoms selected from the group consisting of an aluminum atom, a gallium atom, an indium atom, a titanium atom, and a cobalt atom.

In one form, the intensity ratio can be 2.20 or less.

In one form, the aliphatic polyamide can contain one or more kinds of aliphatic polyamides selected from the group consisting of nylon 6, nylon 11, nylon 12, and nylon 66.

One aspect of the present invention relates to a radio wave absorbing article including the radio wave absorber.

According to one aspect of the present invention, it is possible to provide a radio wave absorber that includes a magnetic powder and an aliphatic polyamide and suppresses the occurrence of the deviation in the position of the absorption peak of transmission attenuation. In addition, according to one aspect of the present invention, it is possible to provide a radio wave absorbing article including the radio wave absorber.

DESCRIPTION OF THE PREFERRED EMBODIMENTS

[Radio Wave Absorber]

One aspect of the present invention relates to a radio wave absorber containing a magnetic powder and an aliphatic polyamide. An intensity ratio ($\alpha/\gamma$) of a diffraction intensity $\alpha$ of an $\alpha$ crystal of the aliphatic polyamide to a diffraction intensity $\gamma$ of a $\gamma$ crystal of the aliphatic polyamide, which are determined by subjecting the radio wave absorber to measurement with an X-ray diffraction method, is 2.60 or less.

The radio wave absorber has radio wave absorbability. In the present invention and the present specification, the "radio wave" means an electromagnetic wave having a frequency of 3 terahertz (THz) or less.

In the present invention and the present specification, the "powder" means an aggregation of a plurality of particles. The "aggregation" is not limited to a form in which particles that constitute an aggregation are in direct contact with each other, and also includes a form in which a binder or the like is interposed between the particles.

It is desired that the radio wave absorber has an absorption peak of transmission attenuation at a frequency to be absorbed according to a use application. For example, the radio wave absorber can contribute to the improvement of the recognition control of a radar. In such a use application, it is desired that the radio wave absorber has an absorption peak of transmission attenuation at a frequency to be absorbed in order to improve the recognition accuracy of a radar. In a case of installing a radio wave absorber having an absorption peak of transmission attenuation at a frequency to be absorbed, for example, on a front side (an incident side of a radio wave incident from the outside) of a radio wave transmitting and receiving unit of a radar, it is possible to improve the recognition accuracy of the radar. However, as described above, it was revealed that the deviation in the position of the absorption peak of transmission attenuation occurs in the radio wave absorber containing a magnetic powder and an aliphatic polyamide. As a result of diligent studies on this point, the inventors of the present inventions newly found that for example, as described later, in a case of adjusting production conditions of the radio wave absorber so that the intensity ratio ($\alpha/\gamma$) of the diffraction intensity $\alpha$ of the $\alpha$ crystal of the aliphatic polyamide to the diffraction intensity $\gamma$ of the $\gamma$ crystal is 2.60 or less, it is possible to suppress the occurrence of the deviation in the position of the absorption peak of transmission attenuation in the radio wave absorber containing a magnetic powder and an aliphatic polyamide.

Hereinafter, the radio wave absorber will be described in more detail.

<Intensity Ratio ($\alpha/\gamma$)>

In the present invention and the present specification, the intensity ratio ($\alpha/\gamma$) of the diffraction intensity $\alpha$ of the $\alpha$ crystal of the aliphatic polyamide and the diffraction intensity $\gamma$ of the $\gamma$ crystal is a value determined by subjecting a radio wave absorber to measurement with the X-ray diffraction method, and more specifically, it is a value determined by carrying out measurement using the X-ray diffraction method under the following conditions.

Use of Cu ray source (output: 40 kV, 30 mA)
Scan condition: 0.01 degree/step in a range of 3 to 50 degrees, 0.1 degrees/min
Measuring method: 2θ/ω scan The above conditions are set values in the X-ray diffractometer. As the X-ray diffractometer, a known stirring device can be used. Examples of the X-ray diffractometer include SmartLab manufactured by Rigaku Corporation. The sample to be subjected to the measurement is a sample cut out from the radio wave absorber to be measured, and the size and shape thereof are not limited. An X-ray diffraction spectrum can be obtained by irradiating any surface of a sample with X-rays and carrying out measurement. In the present invention and the present specification, the intensity at 2θ=20.1 (degree) is defined as the diffraction intensity $\alpha$ of the $\alpha$ crystal of an aliphatic polyamide, and the intensity at 2θ=21.4 (degree) is defined as the diffraction intensity $\gamma$ of the $\gamma$ crystal of the aliphatic polyamide in the X-ray diffraction spectrum (vertical axis: intensity, horizontal axis: diffraction angle 2θ (degree)). The ratio ($\alpha/\gamma$) of $\alpha$ to $\gamma$ determined in this way is defined as the intensity ratio ($\alpha/\gamma$).

The radio wave absorber includes an aliphatic polyamide. The diffraction intensity $\alpha$ determined according to the above method is a diffraction intensity derived from an aliphatic polyamide present as the $\alpha$ crystal in the radio wave absorber, and the diffraction intensity $\gamma$ determined according to the above method is a diffraction intensity derived from an aliphatic polyamide present as the $\gamma$ crystal in the radio wave absorber. As a result, the intensity ratio ($\alpha/\gamma$) is a value that can be an indicator of the presence state of the aliphatic polyamide in the radio wave absorber. Specifically, the intensity ratio ($\alpha/\gamma$) is a value that can be an indicator of the abundance ratio of the aliphatic polyamide present as the $\alpha$ crystal to the aliphatic polyamide present as the $\gamma$ crystal. The aliphatic polyamide can form a hydrogen bond by an amide bond (—C(=O)NH—) intermolecularly and/or intramolecularly. The formation state of this hydrogen bond is different between the $\alpha$ crystal and the $\gamma$ crystal. The inventors of the present invention conceive that in the above-described radio wave absorber, a case where the two types of crystals having hydrogen bond formation states different from each other as described above are contained in the radio wave absorber at an abundance ratio that gives an intensity ratio ($\alpha/\gamma$) is 2.60 or less, leads to the suppression of the occurrence of the deviation in the position of the absorption peak of transmission attenuation. For example, the intensity ratio ($\alpha/\gamma$) can be set to 2.60 or less in a case of controlling the production conditions of the radio wave absorber so that the abundance ratio of the $\alpha$ crystal is decreased and/or the abundance ratio of the $\gamma$ crystal is increased. This point will be further described later.

In the radio wave absorber, the intensity ratio ($\alpha/\gamma$) is 2.60 or less. From the viewpoint of further suppressing the occurrence of the deviation in the position of the absorption peak of transmission attenuation, it is preferably 2.50 or less, and it is more preferably, in the following order; 2.20 or less, 1.50 or less, and 0.50 or less. In addition, the intensity ratio ($\alpha/\gamma$) can be set to, for example, 0.10 or more, 0.20 or more, or 0.30 or more, or it can be set to be lower than the values exemplified here.

<Aliphatic Polyamide>

The radio wave absorber includes an aliphatic polyamide. The polyamide is a resin containing a plurality of amide bonds, and the resin may be a homopolymer or may be a copolymer. The aliphatic polyamide is a polyamide having an aliphatic skeleton.

Examples of one form of the aliphatic polyamide include a form including one or more kinds of units selected from the group consisting of a lactam unit and an aminocarboxylic acid unit. Here, the "lactam unit" refers to a polymerized or polycondensed lactam, and the "aminocarboxylic acid unit" refers to a polymerized or polycondensed aminocarboxylic acid.

Examples of the lactam that constitutes the lactam unit include butyrolactam, pivalolactum, ε-caprolactam, caprilolactam, enantractam, undecanolactam, and laurolactam (dodecanolactam).

Among them, the lactam that constitutes the lactam unit is preferably ε-caprolactam and laurolactam, and it is more preferably ε-caprolactam.

Examples of the aminocarboxylic acid that constitutes the aminocarboxylic acid unit include a ω-aminocarboxylic acid and an α,ω-amino acid, which are compounds in which lactam is opened.

The aminocarboxylic acid that constitutes the aminocarboxylic acid unit is preferably a linear saturated aliphatic carboxylic acid having 4 to 14 carbon atoms, in which the ω-position is substituted with an amino group. Examples of such an aminocarboxylic acid include 6-aminocaproic acid, 11-aminoundecanoic acid, and 12-aminododecanoic acid.

The aliphatic polyamide containing one or more kinds of units selected from the group consisting of a lactam unit and an aminocarboxylic acid unit may be any one of an aliphatic polyamide containing one or more kinds of lactam units and one or more kinds of aminocarboxylic acid units, an aliphatic polyamide containing one or more kinds of lactam units and but not containing an aminocarboxylic acid unit, or an aliphatic polyamide containing one or more kinds of aminocarboxylic acid units but not containing a lactam unit.

Examples of other forms of the aliphatic polyamide include those containing an aliphatic dicarboxylic acid unit and an aliphatic diamine unit. Here, the "aliphatic dicarboxylic acid unit" refers to a polymerized or polycondensed aliphatic dicarboxylic acid, and the "aliphatic diamine unit" refers to a polymerized or polycondensed aliphatic diamine.

Examples of the aliphatic dicarboxylic acid that constitutes the aliphatic dicarboxylic acid unit include a linear saturated aliphatic dicarboxylic acid having 3 or more and 20 or less carbon atoms.

Examples of the linear saturated aliphatic dicarboxylic acid having 3 or more and 20 or less carbon atoms include malonic acid, succinic acid, glutaric acid, adipic acid, pimelic acid, suberic acid, azelaic acid, sebacic acid, dodecanedioic acid, tetradecanedioic acid, hexadecanedioic acid, octadecanedioic acid, eicosanedioic acid, and diglycolic acid.

In one form, the linear saturated aliphatic dicarboxylic acid can have 6 or more carbon atoms.

Specific examples of the linear saturated aliphatic dicarboxylic acid having 6 or more carbon atoms include adipic acid, sebacic acid, dodecanedioic acid, tetradecanedioic acid, hexadecanedioic acid, octadecanedioic acid, and eicosanedioic acid.

Examples of the aliphatic diamine that constitutes the aliphatic diamine unit include a linear saturated aliphatic diamine having 2 or more and 20 or less carbon atoms.

Examples of the linear saturated aliphatic diamine having 2 or more and 20 or less carbon atoms include ethylenediamine, propylenediamine, tetramethylenediamine, pentamethylenediamine, hexamethylenediamine, heptamethylenediamine, octamethylenediamine, nonamethylenediamine, decamethylenediamine, undecamethylenediamine, dodecamethylenediamine, and tridecamethylenediamine.

In addition, the aliphatic polyamide may further contain a unit derived from a trivalent or higher-valent polyvalent aliphatic amine. Examples of the trivalent or higher-valent polyvalent aliphatic amine include bishexamethylenetriamine.

The aliphatic polyamide containing the aliphatic dicarboxylic acid unit and the aliphatic diamine unit can contain one or more kinds of aliphatic dicarboxylic acid units and one or more kinds of aminocarboxylic acid units.

The aliphatic polyamide can be roughly classified into those containing and those not containing a skeleton (for example, an aromatic skeleton) other than the aliphatic skeleton. In one form, the aliphatic polyamide can be a polyamide that contains an aliphatic skeleton but does not contain a skeleton other than the aliphatic skeleton. In addition, in one form, the aliphatic skeleton can be a linear aliphatic skeleton.

Examples of the indicator of the molecular weight of the aliphatic polyamide include a weight-average molecular weight Mw. In one form, the weight-average molecular weight Mw of the aliphatic polyamide is preferably 1,000 or more and 100,000 or less, and it is more preferably 10,000 or more and 50,000 or less.

It is preferable that the weight-average molecular weight Mw of the aliphatic polyamide contained in the radio wave absorber is within the above-described range from the viewpoint of improving the mechanical properties, in particular, water absorption stiffness, thermal and temporal stiffness, and fluidity, as well as tensile strength in a case of being made into a molded product, bending elastic modulus at a time of water absorption, and long-term heat resistance, and the like.

The weight-average molecular weight Mw can be measured by using gel permeation chromatography (GPC).

Specific examples of the aliphatic polyamide include nylon 4, nylon 6, nylon 7, nylon 8, nylon 11, nylon 12, nylon 66, nylon 69, nylon 610, nylon 611, and nylon 612. It is noted that nylon is a general term for the aliphatic polyamide.

The radio wave absorber may include only one kind of aliphatic polyamide and may include two or more kinds thereof. The volume filling rate of the aliphatic polyamide in the radio wave absorber is not particularly limited, and it is, for example, preferably 30% by volume or more, more preferably 50% by volume or more and 92% by volume or less, and still more preferably 65% by volume or more and 85% by volume or less. In a case where the radio wave absorber contains two or more kinds of aliphatic polyamides, the volume filling rate shall refer to the total volume filling rate of the two or more kinds of aliphatic polyamides. This point also identically applies to the volume filling rates of other components. The measuring method for the volume filling rate will be described later.

<Magnetic Powder>

Examples of the magnetic powder contained in the radio wave absorber include powders of various magnetic materials such as ferrite, iron oxide, cobalt, and chromium oxide. The radio wave absorber may contain only one kind of magnetic powder or may contain two or more kinds of magnetic powders in any ratio. From the viewpoint of radio wave absorption performance, the magnetic powder is preferably one or more kinds of magnetic powders selected from the group consisting of a powder of the hexagonal ferrite and a powder of the ε-iron oxide. The kind of the magnetic material that constitutes the magnetic powder contained in the radio wave absorber can be checked by extracting the magnetic powder from the radio wave absorber according to a known method and carrying out an analysis according to the X-ray diffraction method on the extracted magnetic powder. Alternatively, it can be checked by, for example, the following method. A part or all of the radio wave absorber is finely chopped, immersed in a solvent (for example, hexafluoroisopropanol) for 1 or 2 days, and then dried. The dried radio wave absorber is further ground finely and subjected to an analysis according to the X-ray diffraction method.

<<Powder of Hexagonal Ferrite>>

In the present invention and the present specification, the "powder of a hexagonal ferrite" refers to a magnetic powder in which a hexagonal ferrite-type crystal structure is detected as the main phase by an analysis according to the X-ray diffraction method. The main phase refers to a structure to which the highest intensity diffraction peak attributes in the X-ray diffraction spectrum obtained according to the X-ray diffraction method. For example, in a case where the highest intensity diffraction peak in the X-ray diffraction spectrum obtained according to the X-ray diffraction method attributes to the hexagonal ferrite-type crystal structure, it is determined that the hexagonal ferrite-type crystal structure is detected as the main phase. In a case where only a single structure is detected according to the X-ray diffraction method, this detected structure is used as the main phase. The hexagonal ferrite-type crystal structure contains at least an iron atom, a divalent metal atom, and an oxygen atom as constituent atoms. The divalent metal atom is a metal atom that is capable of being a divalent cation, as an ion, and examples thereof include an alkaline earth metal atom such as a strontium atom, a barium atom, or a calcium atom, and a lead atom. In the present invention and the present specification, the hexagonal strontium ferrite powder means one in which the main divalent metal atom contained in this powder is a strontium atom, and the hexagonal barium ferrite powder means one in which the main divalent metal atom contained in this powder is a barium atom. The same applies to other kinds of powders of the hexagonal ferrite. The main divalent metal atom means a divalent metal atom that occupies the largest amount among the divalent metal atoms contained in this powder in terms of % by atom. However, rare earth atoms shall not be included in the above divalent metal atoms. The "rare earth atom" in the present invention and the present specification is selected from the group consisting of a scandium atom (Sc), a yttrium atom (Y), and a lanthanoid atom. The lanthanoid atom is selected from the group consisting of a lanthanum atom (La), a cerium atom (Ce), a praseodymium atom (Pr), a neodymium atom (Nd), a promethium atom (Pm), a samarium atom (Sm), a europium atom (Eu), a gadolinium atom (Gd), a terbium atom (Tb), a dysprosium atom (Dy), a holmium atom (Ho), an erbium atom (Er), a thulium atom (Tm), a ytterbium atom (Yb), and a lutetium atom (Lu).

Regarding the powder of the hexagonal ferrite powder, the hexagonal ferrite that constitutes the powder includes one or more kinds of hexagonal ferrites selected from the group consisting of hexagonal strontium ferrite, hexagonal barium ferrite, hexagonal calcium ferrite, and hexagonal lead ferrite. From the viewpoint of the radio wave absorbability in the high frequency band, it is preferably one or more kinds of hexagonal ferrites selected from the group consisting of hexagonal strontium ferrite, hexagonal barium ferrite, and hexagonal calcium ferrite, more preferably hexagonal strontium ferrite and/or hexagonal barium ferrite, and still more preferably hexagonal strontium ferrite.

In one form, the powder of a hexagonal ferrite contained in the radio wave absorber can be a magnetoplumbite-type (generally referred to as an "M-type") powder of a hexagonal ferrite. The magnetoplumbite-type hexagonal ferrite has a composition represented by a composition formula: $AFe_{12}O_{19}$ in a case where it does not contain an atom that substitutes iron. Here, A can represent one or more kinds of atoms selected from the group consisting of Sr, Ba, Ca, and Pb, and also includes a form in which two or more of these atoms are contained in any ratio.

Examples of the hexagonal ferrite preferable from the viewpoint of the radio wave absorption performance include a substitution-type magnetoplumbite-type hexagonal ferrite in which a part of iron atoms of the magnetoplumbite-type hexagonal ferrite is substituted with an aluminum atom. As one form of such hexagonal ferrite, hexagonal ferrite having a composition represented by Formula 1 can be mentioned.

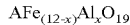
$AFe_{(12-x)}Al_xO_{19}$           Formula 1

In Formula 1, A represents one or more kinds of atoms (hereinafter, also referred to as an "A atom") selected from the group consisting of Sr, Ba, Ca, and Pb, it may be only one kind of atom, it may contain two or more kinds of atoms in any ratio, and, from the viewpoint of improving the uniformity of the composition between particles that constitute the powder, it is preferably only one kind of atom.

From the viewpoint of the radio wave absorbability in the high frequency band, A in Formula 1 is preferably one or more kinds of atoms selected from the group consisting of Sr, Ba, and Ca, and more preferably one or more kinds of atoms selected from the group consisting of Sr and Ba. It is still more preferable that Sr is contained, and it is even still more preferable that A is Sr.

In Formula 1, x satisfies $0.50 \leq x \leq 8.00$.

In one form, x can satisfy $1.50 \leq x \leq 8.00$. From the viewpoint of the radio wave absorption performance in the high frequency band, x is preferably 1.50 or more, more preferably more than 1.50, still more preferably 2.00 or more, and even still more preferably more than 2.00. In addition, from the viewpoint of magnetic properties, x is 8.00 or less, preferably less than 8.00, more preferably 6.00 or less, and still more preferably less than 6.00.

Specific examples of the form which is the substitution-type hexagonal ferrite represented by Formula 1 belonging to a magnetoplumbite type and in which x satisfies $1.50 \leq x \leq 8.00$ include $SrFe_{(9.58)}Al_{(2.42)}O_{19}$, $SrFe_{(9.37)}Al_{(2.63)}O_{19}$, $SrFe_{(9.27)}Al_{(2.73)}O_{19}$, $SrFe_{(9.85)}Al_{(2.15)}O_{19}$, $SrFe_{(10.00)}Al_{(2.00)}O_{19}$, $SrFe_{(90.74)}Al_{(2.26)}O_{19}$, $SrFe_{(10.44)}Al_{(1.56)}O_{19}$, $SrFe_{(9.79)}Al_{(2.21)}O_{19}$, $SrFe_{(90.33)}Al_{(2.67)}O_{19}$, $SrFe_{(7.88)}Al_{(4.12)}O_{19}$, $SrFe_{(7.04)}Al_{(4.96)}O_{19}$, $SrFe_{(7.37)}Al_{(4.63)}O_{19}$, $SrFe_{(6.25)}Al_{(5.75)}O_{19}$, $SrFe_{(7.71)}Al_{(4.29)}O_{19}$, $Sr_{(0.80)}Ba_{(0.10)}Ca_{(0.10)}Fe_{(9.83)}Al_{(2.17)}O_{19}$, $BaFe_{(90.50)}Al_{(2.50)}O_{19}$, $CaFe_{(10.00)}Al_{(2.00)}O_{19}$, and $PbFe_{(9.00)}Al_{(3.00)}O_{19}$. In addition, specific examples thereof also include the substitution-type hexagonal strontium ferrite having a composition shown in Table 1 described later. The composition of hexagonal ferrite can be checked by high frequency inductively coupled plasma emission spectroscopy. Specific examples of the checking method include a method described in Examples described later. Alternatively, after exposing a cross-section by cutting the radio wave absorber or the like, the exposed cross-section is subjected to, for example, energy dispersive X-ray analysis, whereby the composition of the magnetic powder contained in the radio wave absorber can be checked.

In addition, in one form, x can satisfy $0.50 \leq x < 1.50$. For example, from the viewpoint of the radio wave absorption performance in a high frequency band in a range of 35.0 GHz to 66.0 GHz, preferably 45.0 GHz to 66.0 GHz, and more preferably 55.0 GHz to 66.0 GHz, x can be set to 0.50 or more, and x is preferably more than 0.80. Further, from the viewpoint of magnetic properties, x is preferably less than 1.50 and more preferably 1.20 or less. Specific examples of the form which is the substitution-type hexagonal ferrite represented by Formula 1 belonging to a magnetoplumbite type and in which x satisfies $0.50 \leq x < 1.50$ include a substitution-type hexagonal strontium ferrite having the composition shown in Table 1 described later.

In one form, in the powder of the substitution-type hexagonal ferrite, the crystal phase can be a single crystal phase, and a plurality of crystal phases can be included. It is preferable that the crystal phase is a single phase, and it is more preferable that the powder of the hexagonal ferrite is a powder of a substitution-type hexagonal ferrite of which the substitution type is a magnetoplumbite type in which the crystal phase is a single phase.

The case where the "crystal phase is a single phase" refers to a case where only one kind of diffraction pattern showing any crystal structure is observed in an analysis carried out according to the X-ray diffraction method. The analysis according to the X-ray diffraction method can be carried out, for example, according to the method described in Examples described later. In a case where a plurality of crystal phases are included, two or more kinds of diffraction patterns showing any crystal structure are observed in the analysis according to the X-ray diffraction method. Regarding the attribution of the diffraction pattern, for example, a database of the International Centre for Diffraction Data (ICDD, registered trade name) can be referenced. For example, regarding the diffraction pattern of the magnetoplumbite-type hexagonal ferrite containing Sr, "00-033-1340" of the International Centre for Diffraction Data (ICDD) can be referred to. However, in a case where a part of iron atoms is substituted with a substituent atom such as an aluminum atom, the peak position shifts from the peak position observed in a case where the substituent atom is not included.

(Production Method for Powder of Hexagonal Ferrite)

Examples of the production method for a powder of a hexagonal ferrite include a solid phase method and a liquid phase method. The solid phase method is a production method for a powder of a hexagonal ferrite by sintering a mixture obtained by mixing a plurality of solid raw materials. On the other hand, the liquid phase method includes a step of using a solution. Hereinafter, one form of the production method for a powder of the hexagonal ferrite by the liquid phase method and one form of the production method for a powder of the hexagonal ferrite by the solid phase method will be described. However, in a case where the radio wave absorber contains a powder of a hexagonal ferrite, the production method thereof is not limited to the following forms.

Liquid Phase Method

One form of the liquid phase method can include;

a step 1 of obtaining a precipitate from a solution containing one or more kinds of atoms (the A atoms) selected from the group consisting of Sr, Ba, Ca, and Pb, and, as necessary, one or more kinds of substituent atoms that substitute an iron atom, a step 2 of sintering the precipitate obtained in the step 1 to obtain a sintered product.

Hereinafter, each step will be described in detail.

In the step 1, a hexagonal ferrite precursor can be obtained as a precipitate. For example, in order to obtain a powder of a hexagonal ferrite containing an aluminum atom as a substituent atom that substitutes a part of iron atoms, an iron atom, an A atom, and an aluminum atom can be mixed in a solution. In this case, it is presumed that the precipitate obtained in the step 1 is iron hydroxide, aluminum hydroxide, a composite hydroxide of an iron atom, an aluminum atom, and an A atom.

The solution for obtaining the precipitate in the step 1 is preferably a solution containing at least water and more preferably an aqueous solution. For example, a precipitate can be generated by mixing an aqueous solution containing various atoms (hereinafter, also referred to as a "raw material aqueous solution") with an alkaline aqueous solution. In addition, the step 1 can include a step of carrying out the solid-liquid separation of the precipitate.

The raw material aqueous solution can be, for example, an aqueous solution containing a Fe salt, an Al salt, and a salt of an A atom. These salts can be, for example, water-soluble inorganic acid salts such as nitrates, sulfates, and chlorides.

Specific examples of the Fe salt include iron (III) chloride hexahydrate [$FeCl_3 \cdot 6H_2O$] and iron (III) nitrate nonahydrate [$Fe(NO_3)_3 \cdot 9H_2O$].

Specific examples of the Al salts include aluminum chloride hexahydrate [$AlCl_3 \cdot 6H_2O$] and aluminum nitrate nonahydrate [$Al(NO_3)_3 \cdot 9H_2O$].

The salt of the A atom can be one or more kinds of salts selected from the group consisting of a Sr salt, a Ba salt, a Ca salt, and a Pb salt.

Specific examples of the Sr salt include strontium chloride hexahydrate [$SrCl_2 \cdot 6H_2O$], strontium nitrate [$Sr(NO_3)_2$], and strontium acetate 0.5 hydrate [$Sr(CH_3COO)_2 \cdot 0.5H_2O$].

Specific examples of the Ba salt include barium chloride dihydrate [$BaCl_2 \cdot 2H_2O$], barium nitrate [$Ba(NO_3)_2$], and barium acetate [$(CH_3COO)_2Ba$].

Specific examples of the Ca salt include calcium chloride dihydrate [$CaCl_2 \cdot 2H_2O$], calcium nitrate tetrahydrate [$Ca(NO_3)_2 \cdot 4H_2O$], and calcium acetate monohydrate [$(CH_3COO)_2Ca \cdot H_2O$].

Specific examples of the Pb salt include lead (II) chloride [$PbCl_2$] and lead (II) nitrate [$Pb(NO_3)_2$].

However, the above is an example, and other salts can be also used. The mixing ratio between various salts for preparing the raw material aqueous solution may be determined depending on the desired hexagonal ferrite composition.

Examples of the alkaline aqueous solution include a sodium hydroxide aqueous solution and a potassium hydroxide aqueous solution. The concentration of the alkaline aqueous solution can be, for example, 0.1 mol/L to 10 mol/L. However, the kind and the concentration of the alkaline aqueous solution are not limited to the above examples as long as the precipitate can be produced.

The raw material aqueous solution and the alkaline aqueous solution may be simply mixed. The whole amount of the raw material aqueous solution and the whole amount of the alkaline aqueous solution may be mixed at one time, or the raw material aqueous solution and the alkaline aqueous solution may be gradually mixed. Alternatively, the mixing may be carried out by mixing while gradually adding one of the raw material aqueous solution and the alkaline aqueous solution to the other. The method of mixing the raw material aqueous solution with the alkaline aqueous solution is not particularly limited, and examples thereof include a method of mixing with stirring. A stirring unit is not particularly limited either, and a general stirring unit can be used. The stirring time may be set to a time during which a precipitate can be formed, and it can be appropriately set depending on the composition of the raw material aqueous solution, the kind of the stirring unit to be used, and the like.

The temperature (the solution temperature) at which the raw material aqueous solution is mixed with the alkaline aqueous solution is, for example, preferably 100° C. or lower from the viewpoint of preventing explosive boil, and more preferably 95° C. or lower and still more preferably 15° C. or higher and 92° C. or lower from the viewpoint of causing the precipitation reaction to proceed well. As a unit for adjusting the temperature, a general heating device, cooling device, or the like can be used. The pH of the aqueous solution obtained by mixing the raw material aqueous solution with the alkaline aqueous solution, at a temperature of 25° C., is, for example, preferably in a range of 5 to 13 and more preferably in a range of 6 to 12 from the viewpoint that a precipitate is more easily obtained.

In a case where the obtained precipitate is subjected to solid-liquid separation after the precipitate is formed, the method thereof is not particularly limited, and examples thereof include decantation, centrifugation, and filtration (suction filtration, pressure filtration, or the like). For example, in a case where the solid-liquid separation is carried out by centrifugation, the conditions for centrifugation are not particularly limited, and for example, centrifugation can be carried out for 3 to 30 minutes at a rotation speed of 2,000 revolutions per minute (rpm) or more. Further, the centrifugation may be carried out a plurality of times.

Next, the step 2 will be described.

The step 2 is a step of sintering the precipitate obtained in the step 1.

In the step 2, the precursor of hexagonal ferrite can be converted to hexagonal ferrite by sintering the precipitate obtained in the step 1. The sintering can be carried out using a heating device. The heating device is not particularly limited, and a known heating device such as an electric furnace, a sintering device manufactured by a production line, or the like can be used. The sintering can be carried out, for example, in an ambient air atmosphere. The sintering temperature and the sintering time may be set within a range in which the precursor of hexagonal ferrite can be converted to hexagonal ferrite. The sintering temperature is, for example, preferably 900° C. or higher, more preferably in a range of 900° C. to 1,400° C., and still more preferably in a range of 1,000° C. to 1,200° C. The sintering time is, for example, preferably in a range of 1 hour to 10 hours and more preferably in a range of 2 hours to 6 hours. In addition, the precipitate obtained in the step 1 can be dried before sintering. The drying unit is not particularly limited, and examples thereof include a dryer such as an oven. The drying temperature is, for example, preferably in a range of 50° C. to 200° C. and more preferably in a range of 70° C. to 150° C. The drying time is, for example, preferably in a range of 2 hours to 50 hours and more preferably in a range of 5 hours to 30 hours. The above sintering temperature and drying temperature can be the internal ambient temperature of the device for sintering or drying.

The sintered product obtained in the above step 2 can be an aggregated sintered product or a powder-shaped sintered product, in which the precursor of hexagonal ferrite is converted to show the crystal structure of hexagonal ferrite. Further, a step of pulverizing the sintered product can also be carried out. The pulverization can be carried out with a known pulverizing unit such as a mortar and pestle or a pulverizer (a cutter mill, a ball mill, a bead mill, a roller mill, a jet mill, a hammer mill, an attritor, or the like). For example, in the case of pulverizing using a medium, a particle size of the medium (a so-called medium diameter) is, for example, preferably in a range of 0.1 mm to 5.0 mm and more preferably in a range of 0.5 mm to 3.0 mm. The "medium diameter" in a case of a spherical medium means an arithmetic mean of diameters of a plurality of randomly selected media (for example, beads). In a case of a non-spherical medium (for example, a non-spherical bead), it means an arithmetic mean of equivalent circle diameters of a plurality of randomly selected media, which is determined from an observation image obtained from a transmission electron microscope (TEM) or a scanning electron microscope (SEM). Examples of the medium material include glass, alumina, steel, zirconia, and ceramics. In a case of pulverizing with a cutter mill, the pulverizing conditions can be determined depending on the amount of the sintered product to be pulverized, the scale of the cutter mill to be used, and the like. In one form, the rotation speed of the cutter mill can be, for example, about 5,000 to 25,000 rpm.

Solid Phase Method

Examples of the solid raw material that is used in the solid phase method include a compound of an iron atom and a compound of an A atom, and further include a compound of a substituent atom in a case of producing a powder of a substitution-type hexagonal ferrite. These compounds can be an oxide, a carbonate, or the like. The A atom and the substituent atom are as described above. The mixing ratio between a plurality of solid raw materials may be determined according to the desired hexagonal ferrite composition. A raw material mixture can be obtained by mixing a plurality of solid raw materials at the same time or sequentially mixing them in any order, and stirring the resultant mixture. The stirring of the solid raw materials can be carried out by a commercially available stirring device or a stirring device having a known configuration. As an example, the rotation speed during stirring can be set in a range of 300 to 3,000 rpm, and the stirring time can be set in a range of 10 minutes to 90 minutes. However, the rotation speed and the stirring time during stirring may be set according to the configuration of the stirring device to be used, and they are not limited to the range exemplified above. In addition, mixing and/or stirring of solid raw materials is not limited to being carried out under dry conditions. Under wet conditions, for example, a solvent such as water may be added, and mixing and/or stirring may be carried out in a slurry state. The above mixing and stirring can be carried out, for example, in an ambient air atmosphere at room temperature. In the invention and the present specification, the "room temperature" means a temperature in a range of 20° C. to 27° C. unless otherwise specified.

After the above stirring, the obtained raw material mixture can be sintered. In this sintering, the crystallization of the raw material mixture can be promoted, whereby the crystal structure of the hexagonal ferrite can be formed. Regarding the sintering conditions, the sintering temperature can be set, for example, in a range of 1,000° C. to 1,500° C. The sintering temperature can be, for example, the ambient temperature inside the device in which sintering is carried out (for example, the temperature inside the heating furnace). The sintering time can be in a range of 1 hour to 6 hours. However, the above ranges are described as examples, and the sintering may be carried out under conditions under which the crystal structure of the hexagonal ferrite is capable of being formed. The sintering can be carried out, for example, in an ambient air atmosphere.

In the sintering, it is also possible to add a fusing agent to the powder of the raw material mixture and sinter it. As the fusing agent, various fusing agents can be used, and examples thereof include $SrCl_2 \cdot 6H_2O$, $CaCl_2 \cdot 2H_2O$, $MgCl_2$, KCl, NaCl, $BaCl_2 \cdot 2H_2O$, and $Na_2B_4O_7$. The adding amount thereof is, for example, preferably 0.1 to 10 parts by mass and more preferably 0.1 to 8.0 parts by mass with respect to 100 parts by mass of the powder of the raw material mixture.

The raw material mixture before sintering can be subjected to a pulverizing step, and/or the sintered product after the sintering can be subjected to a pulverizing step. In a case of carrying out the pulverization step, it is possible to adjust the size of the particles that constitute the powder of the hexagonal ferrite. The pulverization can be carried out with a known pulverizing unit such as a mortar and pestle or a pulverizer (a cutter mill, a ball mill, a bead mill, a roller mill, a jet mill, a hammer mill, an attritor, or the like).

The powder of the hexagonal ferrite, which has been produced according to the solid phase method, can be easily distinguished from the powder of the hexagonal ferrite, which has been produced according to the liquid phase method. For example, the powder of the hexagonal ferrite, which has been produced according to the liquid phase method, is generally subjected to scanning electron microscope-energy dispersive X-ray spectroscopy (SEM-EDX) analysis due to the production method thereof, whereby precipitates of alkali metal salts can be confirmed on the surface of particles that constitute the powder. In addition, for example, in a case where the powder of the hexagonal ferrite, which has been produced according to the solid phase method, is subjected to the morphological observation of particles by using a field emission-scanning electron microscope (FE-SEM), so-called irregular particles can be usually confirmed. For example, as described above, the powder of the hexagonal ferrite, which has been produced according to the solid phase method, can be easily distinguished from the powder of the hexagonal ferrite, which has been produced according to the liquid phase method. In one form, from the viewpoint of mass productivity, the powder of the hexagonal ferrite is preferably a powder of the hexagonal ferrite, which has been produced according to the solid phase method.

<<Powder of ε-Iron Oxide>>

In the present invention and the present specification, "the powder of the ε-iron oxide" refers to a powder of a magnetic material in which an ε-iron oxide-type crystal structure is detected as the main phase by an analysis carried out according to the X-ray diffraction method. For example, in a case where the highest intensity diffraction peak in the X-ray diffraction spectrum obtained by the analysis according to the X-ray diffraction method attributes to the ε-iron oxide-type crystal structure, it is determined that the ε-iron oxide-type crystal structure is detected as the main phase. The powder of the ε-iron oxide in the present invention and the present specification includes a powder of a so-called unsubstitution-type ε-iron oxide composed of an iron atom and an oxygen atom, and a powder of a so-called substitution-type ε-iron oxide containing one or more kinds of substituent atoms that substitute an iron atom.

(Production Method for Powder of ε-Iron Oxide)

As the production method for a powder of an ε-iron oxide, a method of producing a powder from goethite, a reverse micelle method, and the like are known. All of the above production methods are known. In addition, regarding the production method for a powder of an ε-iron oxide in which a part of iron atoms is substituted with a substituent atom, for example, J. Jpn. Soc. Powder Metallurgy Vol. 61 Supplement, No. 51, pp. S280-S284, J. Mater. Chem. C, 2013, 1, pp. 5200-5206 and the like can be referenced.

As an example, a powder of an ε-iron oxide can be obtained by, for example, a producing method of a powder of an ε-iron oxide through the following steps;

preparing a precursor of an ε-iron oxide (hereinafter, also described as a "precursor preparation step"), subjecting the precursor to a coating film forming treatment (hereinafter, also described as a "coating film forming step"), subjecting the precursor after the coating film forming treatment to heat treatment to convert the precursor to an ε-iron oxide (hereinafter, also described as a "heat treatment step"), and subjecting the ε-iron oxide to coating film removing treatment (hereinafter, also described as a "coating film removing step").

The production method will be further described below. However, the production method described below is an example, and in a case where the radio wave absorber contains a powder of an ε-iron oxide, the powder is not limited to a powder produced by the production method exemplified below.

Precursor Preparation Step

The precursor of the ε-iron oxide refers to a substance that contains an ε-iron oxide-type crystal structure as a main phase in a case of being heated. The precursor can be, for example, a hydroxide, an oxyhydroxide (an oxide hydroxide), or the like, which contains iron and an atom capable of substituting a part of iron in the crystal structure. The precursor preparation step can be carried out by using a coprecipitation method, a reverse micelle method, or the like. A method of preparing such a precursor is known, and the precursor preparation step in the above-described production method can be carried out by a known method.

The ε-iron oxide, which does not contain a substituent atom that substitutes a part of iron atoms, can be represented by a composition formula: $Fe_2O_3$. On the other hand, the ε-iron oxide in which a part of iron atoms is substituted with, for example, one to three kinds of atoms can be represented by a composition formula: $A^1_xA^2_yA^3_zFe_{(2-x-y-z)}O_3$. $A^1$, $A^2$, and $A^3$ each independently represent a substituent atom that substitutes an iron atom, and x, y, and z are each independently equal to or more than 0 and less than 2, where at least one thereof is more than 0 and x+y+z is less than 2. The powder of the ε-iron oxide may contain or may not contain a substituent atom that substitutes an iron atom. The magnetic properties of the powder of the ε-iron oxide can be adjusted by the kind and the substitution amount of the substituent atom. In a case where a substituent atom is contained, examples of the substituent atom include one or more atoms such as an aluminum atom (Al), a gallium atom (Ga), an indium atom (In), a cobalt atom (Co), a titanium atom (Ti), and a rhodium atom (Rh), where one or more kinds of atoms of Al, Ga, and In are preferable. In a case of producing a powder of an ε-iron oxide containing a substituent atom that substitutes an iron atom (Fe), a part of the compound that is a source of Fe in the ε-iron oxide may be replaced with a compound of the substituent atom. The composition of the obtained powder of the ε-iron oxide can be controlled by the substitution amount. Examples of the compound that is a source of an iron atom and various substituent atoms include an inorganic salt (it may be a hydrate) such as a nitrate, a sulfate, or a chloride, an organic salt (it may be a hydrate) such as a pentakis (hydrogen oxalate) salt, a hydroxide, and an oxyhydroxide.

Coating Film Forming Step

In a case where the precursor is heated after the coating film forming treatment, the reaction of converting the precursor to an ε-iron oxide can be allowed to proceed under the coating film. It is also conceived that the coating film can also play a role in preventing the occurrence of sintering during heating. From the viewpoint of easiness of the coating film formation, the coating film forming treatment is preferably carried out in a solution and more preferably carried out by adding a coating film forming agent (a compound for coating film formation) to a solution containing the precursor. For example, in a case where the coating film forming treatment is carried out in the same solution following the precursor preparation, a coating film forming agent can be added to the solution after the precursor preparation and stirred to form a coating film on the precursor. Examples of the coating film that is preferred in that a coating film can be easily formed on a precursor in a solution include a silicon-containing coating film. Examples of the coating film forming agent for forming a silicon-containing coating film include a silane compound such as an alkoxysilane. The silicon-containing coating film can be formed on the precursor by hydrolysis of the silane compound and preferably utilizing a sol-gel method. Specific examples of the silane compound include tetraethoxysilane (tetraethyl orthosilicate (TEOS)), tetramethoxysilane, and various silane coupling agents. For example, the coating film forming treatment can be carried out by stirring a solution that contains a precursor and a coating film forming agent and has a solution temperature of 50° C. to 90° C. for about 5 to 36 hours. The coating film may cover the entire surface of the precursor, or a part of the surface of the precursor may not be covered by the coating film.

Heat Treatment Step

In a case where the precursor after the coating film forming treatment is subjected to heat treatment, the precursor can be converted to an ε-iron oxide. The heat treatment can be carried out on, for example, a powder (a precursor powder having a coating film) collected from a solution that has undergone the coating film forming treatment. The heat treatment step can be carried out, for example, in a heat treatment furnace having a furnace temperature of 900° C. to 1,200° C. for about 3 to 6 hours.

Coating Film Removing Step

In a case of being subjected to the above heat treatment step, the precursor having a coating film is converted to an ε-iron oxide. Since the coating film remains on the ε-iron oxide obtained in this manner, a coating film removing treatment is preferably carried out. The coating film removing treatment can be carried out, for example, by stirring an ε-iron oxide having a coating film in a sodium hydroxide aqueous solution having a concentration of about 4 mol/L and a solution temperature of about 60° C. to 90° C. for 5 to 36 hours. However, the powder of the ε-iron oxide may be a powder produced without undergoing the coating film removing treatment, that is, a powder having a coating film. In addition, the coating film may not be completely removed in the coating film removing treatment, and a part of the coating film may remain in the powder.

A known step can be optionally carried out before and/or after the various steps described above. Examples of such a step include various known steps such as filtration, washing, and drying.

The shape of the particle that constitutes the magnetic powder is not particularly limited, and examples thereof include a spherical shape, a rod shape, a needle shape, a plate shape, and an irregular shape. Examples of the shape of the particle that constitutes the powder of a magnetoplumbite-type hexagonal ferrite include a plate shape, and an irregular shape, and examples of the shape of the particle that constitutes the powder of the ε-iron oxide include a spherical shape.

<<Various Physical Properties that Magnetic Powder can Have>>

The size of the particle that constitutes the magnetic powder contained in the radio wave absorber is not particularly limited. In a case where a mode is denoted by a mode diameter, a 10% cumulative diameter is denoted by $D_{10}$, and a 90% cumulative diameter is denoted by $D_{90}$ in the number-based particle size distribution in the radio wave absorber, which is measured by a laser diffraction and scattering method, the magnetic powder preferably has a mode diameter of 5 μm or more and less than 10 μm. Further, it is more preferable to satisfy $(D_{90}-D_{10})$/mode diameter≤3.0, it is still more preferable to satisfy $(D_{90}-D_{10})$/mode diameter≤2.5, it is still more preferable to satisfy $(D_{90}-D_{10})$/mode diameter≤2.0, it is even still more preferable to satisfy $(D_{90}-D_{10})$/mode diameter≤1.5, and it is even further still more preferable to satisfy $(D_{90}-D_{10})$/mode diameter≤1.0. Since the magnetic powder that has a mode diameter of 5 μm or more and satisfies $(D_{90}-D_{10})$/mode diameter≤3.0 has a relatively small number of fine particles, a radio wave absorber more excellent in radio wave absorption performance tends to be produced by using such a magnetic powder. Since the magnetic powder that has a mode diameter of less than 10 μm and satisfies $(D_{90}-D_{10})$/mode diameter≤3.0 has a relatively small number of coarse particles, a radio wave absorber more excellent in strength tends to be produced by using such a magnetic powder.

The particle size of the magnetic powder (that is, the mode diameter, $D_{10}$, and $D_{90}$) can be controlled by carrying out, for example, classification with a sieve, a centrifuge, or the like, or pulverization with a mortar and pestle, an ultrasonic disperser, or the like. For example, in a case of being controlled by pulverization, the particle size of the magnetic powder can be adjusted by selecting the pulverizing unit, the pulverizing time, the medium material, the medium diameter, or the like. For example, as the pulverizing time becomes long, the particle size of the magnetic powder tends to be small. Further, for example, as the medium diameter becomes small, the particle size of the magnetic powder tends to be small. The value of "$(D_{90}-D_{10})$/mode diameter" can be adjusted, for example, by sorting the particles by classification using a sieve, a centrifuge, or the like after pulverization.

The particle size of the magnetic powder are values determined based on the number-based particle size distribution measured by the laser diffraction and scattering method. Specifically, it can be measured by the following method.

500 mL of cyclohexanone is added to 10 mg of a magnetic powder and diluted, stirred using a shaker for 30 seconds, and the obtained liquid is used as a sample for particle size distribution measurement. Then, the particle size distribution is measured by the laser diffraction and scattering method using the sample for particle size distribution measurement. A laser diffraction/scattering-type particle size distribution analyzer is used as the measurement device.

The particle size of the magnetic powder contained in the radio wave absorber can be checked by, for example, the following method.

The radio wave absorber is finely chopped and then ultrasonically dispersed in a solvent (for example, hexafluoroisopropanol). The obtained dispersion liquid is used as a sample, and the particle size of the magnetic powder can be checked by carrying out the measurement using a laser diffraction and scattering method.

In addition, regarding the magnetic properties of the magnetic powder contained in the radio wave absorber, the magnetic field strength Ha which is 90% of the magnetization quantity obtained in a case where an external magnetic field of 50 kOe is applied is preferably 10.0 kOe or more and 40.0 kOe or less from the viewpoint of radio wave absorption performance. The magnetic field strength Ha of the magnetic powder can be adjusted by the composition of the magnetic material that constitutes the magnetic powder, the production method, or the like.

The magnetic field strength Ha is a value determined by the following method.

Using an oscillating sample magnetometer, the intensity of magnetization of the magnetic powder is measured with respect to an applied magnetic field under the conditions of a maximum applied magnetic field of 50 kOe and a magnetic field sweep rate of 25 Oe/s (where "s" indicates "second") in an environment with an ambient temperature of 23° C. Then, based on the measurement result, a magnetic field (H)—magnetization (M) curve of the powder is obtained. Based on the obtained magnetic field (H)—magnetization (M) curve, a magnetic field strength which corresponds to 90% of a magnetization quantity at an applied magnetic field of 50 kOe is determined, which is denoted by the magnetic field strength Ha. The unit thereof is 1 kOe=($10^6/4\pi$) A/m.

The coercive force (Hc) of the magnetic powder contained in the radio wave absorber is not particularly limited. From the viewpoint of radio wave absorption performance, the coercive force (Hc) of the magnetic powder is preferably, for example, 1.0 kOe or more. The upper limit of the coercive force (Hc) of the magnetic powder is not particularly limited and can be, for example, 18.0 kOe or less.

The saturation magnetization (as) per unit mass of the magnetic powder contained in the radio wave absorber is not particularly limited. From the viewpoint of radio wave absorption performance, the saturation magnetization (as) of the magnetic powder is, for example, preferably 10.0 emu/g or more, more preferably 20.0 emu/g or more, and still more preferably 30.0 emu/g or more. The units thereof is 1 emu/g=1 A·$m^2$/kg.

The upper limit of the saturation magnetization (as) per unit mass of the magnetic powder is not particularly limited and can be, for example, 60.0 emu/g or less.

The above-described coercive force (Hc) and saturation magnetization (as) per unit mass of the magnetic powder are values measured using an oscillating sample magnetometer in an environment of an ambient temperature of 23° C. and conditions of a maximum applied magnetic field of 50 kOe and a magnetic field sweep rate of 25 Oe/s.

In one form, the magnetic powder contained in the radio wave absorber can be a magnetic powder which has been subjected to surface treatment.

In a case where the magnetic powder contained in the radio wave absorber is a surface-treated magnetic powder, a known surface treatment technique can be applied to the surface treatment of the magnetic powder.

Examples of the kinds of surface treatment include an oil treatment with hydrocarbon oil, ester oil, lanolin, or the like; a silicone treatment with dimethylpolysiloxane, methylhydrogenpolysiloxane, methylphenylpolysiloxane, or the like; a fluorine compound treatment with a perfluoroalkyl group-containing ester, perfluoroalkylsilane, a polymer having a perfluoropolyether and a perfluoroalkyl group, or the like; a silane coupling agent treatment with 3-methacryloxypropyltrimethoxysilane, 3-glycidoxypropyltrimethoxysilane, N-2-(aminoethyl)-3-aminopropyltrimethoxysilane, or the like; a titanium coupling agent treatment with isopropyltriisostearoyl titanate, isopropyltris(dioctylpyrophosphate)titanate, or the like; a metal soap treatment; an amino acid treatment with acylglutamic acid or the like; a lecithin treatment with hydrogenated egg yolk lecithin or the like; a polyethylene treatment; a mechanochemical treatment; and a phosphoric acid compound treatment with phosphoric acid, phosphorous acid, a phosphate, a phosphite, or the like.

For example, in a case where the magnetic powder is subjected to a phosphoric acid compound treatment, it is possible to thickly form a highly polar layer on the surface of the particle that constitutes the magnetic powder.

In addition to phosphoric acid, the phosphoric acid compound includes phosphorous acid, hypophosphorous acid, pyrophosphoric acid, a linear polyphosphoric acid, a cyclic metaphosphoric acid, and salts thereof.

In a case where the phosphoric acid compound has a form of a salt, the phosphoric acid compound is preferably a metal salt.

The metal salt is not particularly limited, and examples thereof include an alkali metal salt and an alkaline earth metal salt.

In addition, the phosphoric acid compound may be an ammonium salt.

In the phosphoric acid compound treatment, only one kind of phosphoric acid compound may be used, or two or more kinds thereof may be used.

In the phosphoric acid compound treatment, the phosphoric acid compound is generally mixed with a chelating agent, a neutralizing agent, and the like to be used as the surface treatment agent.

In the phosphoric acid compound treatment, as the surface treatment agent, an aqueous solution containing a phosphoric acid compound which is generally commercially available can also be used.

The phosphoric acid compound treatment of the magnetic powder can be carried out, for example, by mixing the magnetic powder and a surface treatment agent containing a phosphoric acid compound. Conditions such as mixing time and temperature may be appropriately set depending on the intended purpose. In the phosphoric acid compound treatment, an insoluble phosphoric acid compound can be precipitated on the surface of the particle that constitutes the magnetic powder by utilizing the dissociation (the equilibrium) reaction of the phosphoric acid compound.

Regarding the phosphoric acid compound treatment, for example, "Surface Technology", Vol. 61, No. 3, p 216, 2010, or "Surface Technology", Vol. 64, No. 12, p 640, 2013 can be referenced.

In addition, regarding the silane coupling agent treatment, the silane coupling agent is preferably a silane coupling agent having a hydrolyzable group.

In the silane coupling agent treatment using a silane coupling agent having a hydrolyzable group, the hydrolyzable group in the silane coupling agent is hydrolyzed by water to become a hydroxy group, and this hydroxy group undergoes a dehydrative condensation reaction with a hydroxy group on the surface of the silica particles, whereby the surface of the particles is modified.

Examples of the hydrolyzable group include an alkoxy group, an acyloxy group, and a halogeno group.

The silane coupling agent may have a hydrophobic group as a functional group.

Examples of the silane coupling agent having a hydrophobic group as a functional group include alkoxysilanes such as methyltrimethoxysilane (MTMS), dimethyldimethoxysilane, phenyltrimethoxysilane, methyltriethoxysilane, dimethyldiethoxysilane, phenyltriethoxysilane, n-propyltrimethoxysilanes, n-propyltriethoxysilane, hexyltrimethoxysilane, hexyltriethoxysilane, and decyltrimethoxysilane; chlorosilanes such as methyltrichlorosilane, dimethyldichlorosilane, trimethylchlorosilane, and phenyltrichlorosilane; and hexamethyldisilazane (HMDS).

Further, the silane coupling agent may have a vinyl group as a functional group.

Examples of the silane coupling agent having a vinyl group as a functional group include alkoxysilanes such as methacryloxypropyltriethoxysilane, methacryloxypropyltrimethoxysilane, methacryloxypropylmethyldiethoxysilane, methacryloxypropylmethyldimethoxysilane, vinyltriethoxysilane, vinyltrimethoxysilane, vinylmethyldimethoxysilane; chlorosilanes such as vinyltrichlorosilane and vinylmethyldichlorosilane; and divinyltetramethyldisilazane.

Further, the silane coupling agent may have an amino group as a functional group.

Examples of the silane coupling agent having an amino group as a functional group include aminopropyltriethoxysilane, aminopropyltrimethoxysilane, N-2-(aminoethyl)-3-aminopropylmethyldimethoxysilane, N-2-(aminoethyl)-3-aminopropyltrimethoxysilane, N-2-(aminoethyl)-8-aminooctyltrimethoxysilane, a both-terminal amine type aminoalkoxysilane (for example, FM-3311, FM-3321, or FM-3325, manufactured by JNC Corporation), and a polyfunctional amine type aminoalkoxysilane (for example, X-12-972F manufactured by Shin-Etsu Chemical Co., Ltd.).

In the silane coupling agent treatment, only one kind of silane coupling agent may be used, or two or more kinds thereof may be used.

As the surface treatment method, a known method can be applied. Examples of the surface treatment method include a method of mixing a magnetic powder and a surface treatment agent using a mixer such as a Henschel mixer, a method of spraying a surface treatment agent or the like on particles that constitutes the magnetic powder, and a method of mixing a liquid containing a surface treatment agent or the like, which is obtained by dissolving or dispersing a surface treatment agent or the like in an appropriate solvent, with a magnetic powder, and then removing the solvent.

<Volume Filling Rate of Magnetic Powder>

The radio wave absorber contains a magnetic powder and an aliphatic polyamide. The filling rate of the magnetic powder of a hexagonal ferrite in the radio wave absorber is not particularly limited. For example, in one form, the filling rate of the magnetic powder in the radio wave absorber can be 35% by volume or less and can be also in a range of 15% to 35% by volume in terms of the volume filling rate. In addition, in another form, the volume filling rate can be 35% by volume or more. In this case, the volume filling rate can be, for example, in a range of 35% to 60% by volume, and it can also be in a range of 35% to 50% by volume. The volume filling rate means a volume-based content with respect to the total volume (100% by volume) of the radio wave absorber.

For example, the magnetic powder is collected from the radio wave absorber by a known method, and the volume filling rate of the magnetic powder in the radio wave absorber can be determined as "(the volume of the collected magnetic powder/the total volume of the radio wave absorber)×100". Here, the total volume of the radio wave absorber and the volume of the magnetic powder can be determined by a known method. Alternatively, in a case where the composition of a composition for forming a radio wave absorber used for preparing a radio wave absorber is known, the volume filling rate of the magnetic powder in the radio wave absorber can be determined from this known composition.

In addition, the volume filling rate of the magnetic powder in the radio wave absorber can also be determined by the following method using a cross-section SEM image acquired by a scanning electron microscope (SEM).

A measurement sample having a square plane, one side of which has a length of 5 mm, is cut out from a randomly determined position of the radio wave absorber to be measured. A sample for cross-section observation is prepared from the cut-out sample. The sample for cross-section observation is prepared by focused ion beam (FIB) processing. The prepared cross-section observation sample is observed by SEM, and a cross-section image (SEM image) is taken. As the SEM, a field emission scanning electron microscope (FE-SEM) is used. Using the FE-SEM, a cross-section observation sample is set on a stage so that the FIB-processed cross-section faces upward, and a cross-section SEM image with a visual field of 30 μm x 40 μm is obtained under the conditions of an acceleration voltage of 15 kV and an observation magnification of 3,000 folds. The obtained cross-section SEM image is subjected to binarization processing, and the proportion (in terms of the area) of the magnetic powder is calculated.

The above operation is carried out on five measurement samples cut out from different positions of the radio wave absorber to be measured, and the volume filling rate of the magnetic powder can be determined as the arithmetic mean of the obtained five values. As necessary, the elemental analysis of the cross-section observation sample is carried out to specify the portion of the magnetic powder in the cross-section SEM image.

The volume filling rates of the other components described in the present specification can also be determined in the same manner as described above.

<Additive>

The radio wave absorber contains a magnetic powder and an aliphatic polyamide, and may optionally contain one or more additives. Examples of the additive include an antioxidant, a light stabilizer, a dispersing agent, a dispersing aid, a fungicide, an antistatic agent, a plasticizer, an impact resistance improver, a crystal nucleating agent, a lubricant, a surfactant, a pigment, a dye, a filler, a mold release agent (fatty acid, a fatty acid metal salt, an oxyfatty acid, a fatty acid ester, an aliphatic partially saponified ester, paraffin, a low molecular weight polyolefin, a fatty acid amide, an alkylenebis fatty acid amide, an aliphatic ketone, a fatty acid lower alcohol ester, a fatty acid polyhydric alcohol ester, a fatty acid polyglycol ester, a modified silicone, and the like), a processing aid, an antifogging agent, a drip inhibitor, and an antibacterial agent. One component of the additive may carry out two or more functions. The radio wave absorber can contain, as the additive, a commercially available product or a product produced by a known method, at any proportion.

(Antioxidant)

In one form, the radio wave absorber of the present disclosure can contain an antioxidant.

The antioxidant is not particularly limited, and a known antioxidant can be used.

Regarding examples of the antioxidant, for example, "Comprehensive Technology for Polymer Stabilization—Mechanism and Application Development—" published by CMC Publishing Co., Ltd., supervised by Yasukazu Okatsu can be referenced.

Examples of the kind of the antioxidant include a phenol-based antioxidant, an amine-based antioxidant, a phosphorus-based antioxidant, and a sulfur-based antioxidant.

As the antioxidant, it is preferable to use a phenol-based antioxidant and/or an amine-based antioxidant in combination with a phosphorus-based antioxidant and/or a sulfur-based antioxidant.

Examples of the phenol-based antioxidant include ADEKA STAB AO-20, ADEKA STAB AO-30, ADEKA STAB AO-40, ADEKA STAB AO-50, ADEKA STAB AO-60, ADEKA STAB AO-80, and ADEKA STAB AO-330, manufactured by ADEKA Corporation; and IRGANOX 1010, IRGANOX 1035, IRGANOX 1076, IRGANOX 1098, IRGANOX 1135, IRGANOX 1330, IRGANOX 1726, IRGANOX 245, IRGANOX 259, IRGANOX 3114, and IRGANOX 565, manufactured by BASF Japan Ltd. The above "ADEKA STAB" and "IRGANOX" are both registered trade names.

Examples of the amine-based antioxidants include Sanol LS-770, Sanol LS-765, and Sanol LS-2626, manufactured by Mitsubishi-Chemical Foods Corporation; ADEKA STAB LA-77, ADEKA STAB LA-57, ADEKA STAB LA-52, ADEKA STAB LA-62, ADEKA STAB LA-63, ADEKA STAB LA-67, ADEKA STAB LA-68, and ADEKA STAB LA-72, manufactured by ADEKA Corporation; and TINUVIN 123, TINUVIN 144, TINUVIN 622, TINUVIN 765, and TINUVIN 944, manufactured by BASF Japan Ltd. The above "ADEKA STAB" and "TINUVIN" are both registered trade names.

Further, in the above radio wave absorber, an amine-based compound capable of quenching radicals can also be contained as the antioxidant. Examples of such an amine-based compound include polyethylene glycol bis TEMPO [Sigma-Aldrich Co., LLC] and sebacic acid bis TEMPO. Here, "TEMPO" is an abbreviation for tetramethylpiperidin-1-oxyl.

Examples of the phosphorus-based antioxidant include ADEKA STAB PEP-8, ADEKA STAB PEP-36, ADEKA STAB HP-10, and ADEKA STAB 2112, manufactured by ADEKA Corporation; and IRGAFOS 168 manufactured by BASF Japan Ltd. The above "ADEKA STAB" and "IRGAFOS" are both registered trade names.

Examples of the sulfur-based antioxidant include ADEKA STAB AO-412S and ADEKA STAB AO-5035, manufactured by ADEKA Corporation. The above "ADEKA STAB" is a registered trade name.

Among the above, the phenol-based antioxidant is preferably one or more selected from the group consisting of ADEKA STAB AO-20, ADEKA STAB AO-60, ADEKA STAB AO-80, and IRGANOX 1010, the amine-based antioxidant is preferably ADEKA STAB LA-52, the phosphorus-based antioxidant is preferably ADEKA STAB PEP-36, and the sulfur-based antioxidant is preferably ADEKA STAB AO-412S.

In a case of containing an antioxidant, the above radio wave absorber may contain only one kind of antioxidant or may contain two or more kinds of antioxidants.

In a case where the above radio wave absorber contains an antioxidant, the content of the antioxidant in the radio wave absorber is not particularly limited, and it is, for example, preferably 0.1 parts by mass to 10 parts by mass and more preferably 0.5 parts by mass to 5 parts by mass with respect to 100 parts by mass of the aliphatic polyamide from the viewpoint of both suppressing the decomposition of the aliphatic polyamide and suppressing the bleeding of the antioxidant.

(Light Stabilizer)

In one form, the radio wave absorber of the present disclosure can contain a light stabilizer.

Examples of the light stabilizer include a hindered amine light stabilizer (a HALS), an ultraviolet absorbing agent, and a singlet oxygen quencher.

In a case of containing a light stabilizer, the above radio wave absorber may contain only one kind of light stabilizer or may contain two or more kinds of light stabilizers.

The HALS may be a HALS having a high molecular weight, a HALS having a low molecular weight, or a combination of a HALS having a high molecular weight and a HALS having a low molecular weight. In the present invention and the present specification, the "HALS having a high molecular weight" means a hindered amine-based light stabilizer having a weight-average molecular weight of more than 1,000. In addition, in the present invention and the present specification, the "HALS having a low molecular weight" means a hindered amine-based light stabilizer having a molecular weight of 1,000 or less (preferably 900 or less and more preferably 600 to 900).

HALS Having High Molecular Weight

Examples of the HALS having a high molecular weight include, as an oligomer-type HALS, poly [6-(1,1,3,3-tetramethylbutyl)imino-1,3,5-triazine-2,4-di-yl] [(2,2,6,6-tetramethyl-4-piperidyl)imino]hexamethylene [(2,2,6,6-tetramethyl-4-piperidyl)imino] and dimethyl succinate-1-(2-hydroxyethyl)-4-hydroxy-2,2,6,6-tetramethylpiperidine polycondensate.

Examples of the commercially available product of the HALS having a high molecular weight include CHIMASSORB 944LD and TINUVIN 622LD, manufactured by BASF Japan Ltd. The above "CHIMASSORB" and "TINUVIN" are both registered trade names.

In a case where the radio wave absorber contains the HALS having a high molecular weight, the content of the HALS having a high molecular weight in the radio wave absorber is not particularly limited. In one form, it is preferable that the content of the HALS having a high molecular weight in the above radio wave absorber is 0.2% by mass to 10-% by mass with respect to the total mass of the radio wave absorber.

It is preferable that the content of the HALS having a high molecular weight in the above radio wave absorber is 0.2% by mass or more with respect to the total mass of the radio wave absorber from the viewpoint of improving weather fastness.

In a case where the content of the HALS having a high molecular weight in the above radio wave absorber is 10% by mass or less with respect to the total mass of the radio wave absorber, the decrease in mechanical strength and the occurrence of blooming tend to be further suppressed.

HALS Having Low Molecular Weight

Examples of the HALS having a low molecular weight include tris(2,2,6,6-tetramethyl-4-piperidyl)benzene-1,3,5-tricarboxylate, tris(2,2,6,6-tetramethyl-4-piperidyl)-2-acetoxypropane-1,2,3-tricarboxylate, tris(2,2,6,6-tetramethyl-4-piperidyl)-2-hydroxypropane-1,2,3-tricarboxylate, tris(2,2,6,6-tetramethyl-4-piperidyl)triazine-2,4,6-tricarboxylate, tris(2,2,6,6-tetramethyl-4-piperidyl)butane-1,2,3-tricarboxylate, tetrakis(2,2,6,6-tetramethyl-4-piperidyl)propane-1,1,2,3-tetracarboxylate, tetrakis(2,2,6,6-tetramethyl-4-piperidyl) 1,2,3,4-butanetetracarboxylate, tetrakis(1,2,2,6,6-pentamethyl-4-piperidyl) 1,2,3,4-butanetetracarboxylate, and 2-(3,5-di-t-butyl-4-hydroxybenzyl)-2-n-butylmalonate bis(1,2,2,6,6-pentamethyl-4-piperidyl).

Examples of the commercially available product of the HALS having a low molecular weight include ADEKA STAB LA-57 and ADEKA STAB LA-52, manufactured by ADEKA Corporation; and TINUVIN 144 manufactured by BASF Japan Ltd. The above "ADEKA STAB" and "TINUVIN" are both registered trade names.

In a case where the radio wave absorber contains the HALS having a low molecular weight, the content of the HALS having a low molecular weight in the radio wave absorber is not particularly limited. In one form, it is preferable that the content of the HALS having a low molecular weight in the above radio wave absorber is 0.2% by mass to 10-% by mass with respect to the total mass of the radio wave absorber.

It is preferable that the content of the HALS having a low molecular weight in the above radio wave absorber is 0.2% by mass or more with respect to the total mass of the radio wave absorber from the viewpoint of improving weather fastness.

In a case where the content of the HALS having a low molecular weight in the above radio wave absorber is 10% by mass or less with respect to the total mass of the radio wave absorber, the decrease in mechanical strength and the occurrence of blooming tend to be further suppressed.

Ultraviolet Absorbing Agent

Examples of the ultraviolet absorbing agent include benzotriazole-based ultraviolet absorbing agents such as 2-(2'-hydroxy-3',5'-di-t-butylphenyl)benzotriazole, 2-(3,5-di-t-amyl-2-hydroxyphenyl)benzotriazole, 2-(2'-hydroxy-5'-methyl-phenyl)benzotriazole, 2-(2'-hydroxy-5'-t-octylphenyl)benzotriazole, 2-(2'-hydroxy-3',5'-di-t-amylphenyl)benzotriazole, 2-[2'-hydroxy-3'-(3",4",5",6"-tetrahydrophthalimidemethyl)-5'-methylphenyl]benzotriazole, 2,2'-methylenebis [4-(1,1,3,3-tetramethylbutyl)-6-(2H-benzotriazole-2-yl)phenol], 2-[2-hydroxy-3,5-bis($\alpha$,$\alpha$-dimethylbenzyl)phenyl]-2H-benzotriazole, 2-(2-hydroxy-4-octyloxyphenyl)-2H-benzotriazole, and 2-(2H-benzotriazole-2-yl)-4-methyl-6-(3,4,5,6-tetrahydrophthalimidylmethyl)phenol; benzophenone-based ultraviolet absorbing agents such as 2-hydroxy-4-methoxybenzophenone, 2,4-dihydroxybenzophenone, 2,2'-dihydroxy-4-methoxybenzophenone, 2,2'-dihydroxy-4,4'-dimethoxybenzophenone, 2-hydroxy-4-n-octoxybenzophenone, 2,2',4,4'-tetrahydroxybenzophenone, 4-dodecyloxy-2-hydroxybenzophenone, a 3,5-di-t-butyl-4-hydroxybenzoylbenzoic acid n-hexadecyl ester, 1,4-bis(4-benzoyl-3-hydroxyphenoxy)butane, 1,6-bis(4-benzoyl-3-hydroxyphenoxy)hexane; and cyanoacrylate-based ultraviolet absorbing agents represented by ethyl-2-cyano-3,3-diphenylacrylate.

Examples of the commercially available ultraviolet absorbing agent include TINUVIN 320, TINUVIN 328, TINUVIN 234, TINUVIN 1577, TINUVIN 622, and IRGANOX series, manufactured by BASF Japan Ltd.; ADEKA STAB LA31 manufactured by ADEKA Corporation; and SEESORB 102, SEESORB 103, and SEESORB 501, manufactured by SHIPRO KASEI KAISHA, Ltd. The above-described "TINUVIN", "IRGANOX", "ADEKA STAB", and "SEESORB" are all registered trade names.

In a case where the radio wave absorber contains an ultraviolet absorbing agent, the content of the ultraviolet absorbing agent in the radio wave absorber is not particularly limited. In one form, it is preferable that the content of the ultraviolet absorbing agent in the above radio wave absorber is 0.2% by mass to 10% by mass with respect to the total mass of the radio wave absorber.

It is preferable that the content of the ultraviolet absorbing agent in the above radio wave absorber is 0.2% by mass or more with respect to the total mass of the radio wave absorber from the viewpoint of improving weather fastness.

In a case where the content of the ultraviolet absorbing agent in the above radio wave absorber is 10% by mass or less with respect to the total mass of the radio wave absorber, the decrease in mechanical strength tends to be suppressed, and the occurrence of blooming tend to be suppressed.

—Singlet Oxygen Quencher—

In a case where the radio wave absorber includes a singlet oxygen quencher, the content of the singlet oxygen quencher in the radio wave absorber is not particularly limited. In one form, it is preferable that the content of the singlet oxygen quencher in the above radio wave absorber is 0.2% by mass to 10% by mass with respect to the total mass of the radio wave absorber.

It is preferable that the content of the singlet oxygen quencher in the above radio wave absorber is 0.2% by mass or more with respect to the total mass of the radio wave absorber from the viewpoint of improving weather fastness.

In a case where the content of the singlet oxygen quencher in the above radio wave absorber is 10% by mass or less with respect to the total mass of the radio wave absorber, the decrease in mechanical strength tends to be suppressed, and the occurrence of blooming tend to be suppressed.

<Production Method for Radio Wave Absorber>

The production method for the radio wave absorber of the present disclosure is not particularly limited. For example, the radio wave absorber can be produced by a known method using a magnetic powder, a binder, and, as necessary, a solvent, and other additives. The aliphatic polyamide is used as a binder for producing the radio wave absorber. For example, the radio wave absorber can be a molded product obtained by molding a composition containing a magnetic powder and an aliphatic polyamide (a composition for forming a radio wave absorber). The composition for forming a radio wave absorber of the present disclosure can be manufactured by a known method using a magnetic powder, an aliphatic polyamide, and, as necessary, a solvent, an additive, and the like. The composition for forming a radio wave absorber can be prepared as a kneaded material by kneading, while heating, a mixture of, for example, a magnetic powder, an aliphatic polyamide, and, as necessary, a solvent, an additive. The kneaded material can be obtained in any shape such as an aggregate shape or a pellet shape. The kneaded material is molded into a desired shape by a known molding method such as extrusion molding, press molding, injection molding, or in-mold forming, whereby a radio wave absorber (a molded product) can be obtained. In one form, the abundance ratio of the $\alpha$ crystal and the $\gamma$ crystal of the aliphatic polyamide can be adjusted depending on the cooling conditions after molding, whereby the intensity ratio ($\alpha/\gamma$) of the radio wave absorber can be controlled. According to the study by the inventors of the present invention, there may be a tendency that the value of the intensity ratio ($\alpha/\gamma$) decreases as the cooling is carried out more rapidly. It is presumed to be because the $\gamma$-crystal may be more likely to be formed as the cooling is carried out more rapidly.

The shape of the radio wave absorber is not particularly limited and may be any shape such as a plate shape or a linear shape. The "plate shape" includes a sheet shape and a film shape. The plate-shaped radio wave absorber can also be called a radio wave absorbing plate, a radio wave absorbing sheet, a radio wave absorbing film, or the like. The radio wave absorber may be a radio wave absorber having a single composition (for example, a single-layer radio wave absorbing plate) or a combination of two or more parts having different compositions (for example, a laminate). Further, the radio wave absorber may have a planar shape, may have a three-dimensional shape, or may be a combination of a portion having a planar shape and a portion having a three-dimensional shape. Examples of the planar shape include a sheet shape and a film shape. Examples of the three-dimensional shape include a tubular shape (a cylindrical shape, rectangular tubular shape, or the like), a horn shape, and a box shape (for example, at least one of the surfaces thereof is open).

For example, the thickness of the radio wave absorber is preferably 20 mm or less, more preferably 10 mm or less, and still more preferably 5 mm or less, from the viewpoint of easiness of handling. From the viewpoint of mechanical properties, the thickness is preferably 1 mm or more and more preferably 2 mm or more. In a case where the radio wave absorber is a laminate, the thickness means the total thickness of the radio wave absorber that constitutes the laminate. The thickness of the radio wave absorber is a value measured using a digital length measuring machine and, specifically, is an arithmetic mean of the measured values measured at nine points which are randomly selected.

The composition for forming a radio wave absorber may contain or may not contain a solvent. In a case where the radio wave absorbing composition contains a solvent, the solvent is not particularly limited, and examples thereof include water, an organic solvent, and a mixed solvent of water and an organic solvent.

Examples of the organic solvent include alcohols such as methanol, ethanol, n-propanol, i-propanol, and methoxypropanol, ketones such as acetone, methyl ethyl ketone, and cyclohexanone, tetrahydrofuran, acetonitrile, ethyl acetate, and toluene. Among these, the solvent is preferably ketones and more preferably cyclohexanone from the viewpoint of drying rate. In a case where the composition for forming a radio wave absorber contains a solvent, the content of the solvent in the composition is not particularly limited and may be determined depending on the production method for a radio wave absorber.

The composition for forming a radio wave absorber can be prepared by mixing the above components. The mixing method is not particularly limited, and examples thereof include a method of mixing by stirring. As the stirring unit, a known stirring device can be used. Examples of the stirring device include mixers such as a paddle mixer and an impeller mixer. The stirring time may be set depending on the kind of the stirring device, the composition of a composition for forming a radio wave absorber, or the like.

Examples of one form of the production method for the radio wave absorber include a method of molding the composition for forming a radio wave absorber into a desired shape by a known molding method as exemplified above.

In addition, examples of another form of the production method for the radio wave absorber include a method of applying the composition for forming a radio wave absorber onto a support and producing the radio wave absorber as a radio wave absorbing layer. The support that is used here may be removed before the radio wave absorber is incorporated into an article to which the radio wave absorbability should be imparted or may be incorporated into the article together with the radio wave absorber without being removed.

The support is not particularly limited, and a known support can be used. Examples of the support include a metal plate (a plate of metal such as aluminum, zinc, or copper), a glass plate, a plastic sheet [a sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which the metal exemplified in the metal plate described above is laminated or vapor-deposited. The plastic sheet is preferably biaxially stretched. The shape, structure, size, and the like of the support can be appropriately selected. Examples of the shape of the support include a plate shape. The structure of the support may be a monolayer structure or a laminated structure of two or more layers. The size of the support can be appropriately selected depending on the size of the radio wave absorber. The thickness of the support is generally approximately 0.01 mm to 10 mm, for example, preferably 0.02 mm to 3 mm and more preferably 0.05 mm to 1 mm, from the viewpoint of handleability.

The method of applying the composition for forming a radio wave absorber on a support is not particularly limited, and examples thereof include methods using a die coater, a knife coater, an applicator, and the like. The method of drying a coating film formed by applying the composition for forming a radio wave absorber is not particularly limited, and examples thereof include a method using a known heating device such as an oven. The drying temperature and the drying time are not particularly limited. For example, the drying temperature can be in a range of 70° C. to 90° C., and the drying time can be in a range of 1 hour to 3 hours.

The radio wave absorber can be incorporated into various articles to which radio wave absorbability is desired to be imparted. For example, the plate-shaped radio wave absorber can be incorporated into an article in any form as it is or by being bent at any portion. In addition, it can be adjusted to a desired shape by injection molding or the like to be incorporated into an article.

By the way, the on-vehicle radar, which has been attracting attention in recent years, is a radar that uses radio waves in the millimeter wave frequency band. The millimeter waves are electromagnetic waves having a frequency of 30.0 GHz to 300.0 GHz. The radio wave absorber preferably has an absorption peak of transmission attenuation in the frequency of the radio wave, that is, one or more frequencies in the frequency band of 3 terahertz (THz) or less. From the viewpoint of the usefulness for improving the recognition accuracy of the on-vehicle radar, the frequency at which the radio wave absorber has an absorption peak of transmission attenuation is preferably in the millimeter wave frequency band, that is, a frequency band of 30.0 GHz to 300.0 GHz, more preferably in a frequency band of 60.0 GHz to 150.0 GHz, still more preferably in a frequency band of 60.0 GHz to 90.0 GHz, and even still more preferably in a frequency band of 75.0 GHz to 85.0 GHz. Such a radio wave absorber is suitable as a radio wave absorber that is incorporated on a front side (an incident side of a radio wave incident from the outside) of a radio wave transmitting and receiving unit in an on-vehicle radar in order to reduce the side lobe of the on-vehicle millimeter-wave radar.

In addition, from the viewpoint of the usefulness for improving the recognition accuracy of the radio wave absorbing article that is used in a wireless technology field such as a motion sensor field, the frequency at which the radio wave absorber has an absorption peak of transmission attenuation is preferably in the millimeter wave frequency band, that is, a frequency band of 30.0 GHz to 300.0 GHz. From the viewpoint of the above-described usefulness, the frequency at which the radio wave absorber has an absorption peak of transmission attenuation is more preferably 35.0 GHz or more, still more preferably 45.0 GHz or more, and still more preferably 55.0 GHz or more. In addition, from the viewpoint of the above-described usefulness, the frequency at which the radio wave absorber has an absorption peak of transmission attenuation is more preferably 90.0 GHz or less and still more preferably 66.0 GHz or less. Such a radio wave absorber is suitable as a radio wave absorber for improving recognition accuracy in wireless equipment such as an internal sensor of a cellular phone and a biological information sensor. Such a radio wave absorber can be suitably used, for example, in a radio wave absorbing article for a band of 55.0 to 66.0 GHz. In the present invention and the present specification, "the radio wave absorbing article" is an article having radio wave absorbability to radio waves of one or more frequencies, and in a case where a radio wave absorber is incorporated into the article as at least a part thereof, the above radio wave absorbability can be obtained. In one form, the radio wave absorber can be used for a radio wave absorbing article in a band of 55.0 GHz to 66.0 GHz. The radio wave absorbing article for a band of 55.0 GHz to 66.0 GHz is an article having radio wave absorbability to radio waves of one or more frequencies in a frequency band of 55.0 GHz to 66.0 GHz. Examples of such an article include the above-described various wireless equipment. In a case where the radio wave absorber is incorporated into such a radio wave absorbing article, the recognition accuracy can be improved.

In the radio wave absorber, the intensity ratio ($\alpha/\gamma$) is 2.60 or less. This can contribute to suppressing the occurrence of the deviation in the position of the absorption peak of transmission attenuation in the radio wave absorber containing a magnetic powder and an aliphatic polyamide. From the viewpoint of facilitating the control of the transmission attenuation characteristics of the radio wave absorber depending on the kind of the magnetic powder, it is preferable that the occurrence of the deviation in the position of the absorption peak of transmission attenuation can be suppressed.

[Radio Wave Absorbing Article]

One aspect of the present invention relates to a radio wave absorbing article including the radio wave absorber. Specific examples of the radio wave absorbing article include an on-vehicle radar. Specific examples thereof include wireless equipment such as an internal sensor of a cellular phone and a biological information sensor. In addition, in one form, the radio wave absorbing article can be a radio wave absorbing article in a band of 55.0 GHz to 66.0 GHz. It suffices that the radio wave absorbing article includes the radio wave absorber according to one aspect of the present invention. Other configurations of the radio wave absorbing article are not particularly limited, and a known technique related to the radio wave absorbing article can be applied.

EXAMPLES

Hereinafter, the present invention will be described based on Examples. However, the present invention is not limited to the embodiments shown in Examples. Unless otherwise specified, steps and evaluations described below were carried out in an environment of an ambient air atmosphere of an ambient temperature of 23° C.±1° C.

[Preparation of Magnetic Powders 1 to 3, 6, and 7]

Strontium carbonate [$SrCO_3$], $\alpha$-iron (III) oxide [$\alpha$-$Fe_2O_3$], and aluminum oxide [$Al_2O_3$] were mixed, 5 parts by mass of a fusing agent (strontium chloride hexahydrate [$SrCl_2 \cdot 6H_2O$]) was further added with respect to 100 parts by mass of the obtained mixture, and the resultant mixture was stirred using an EIRICH intensive mixer (model: EL1, manufactured by EIRICH) under the conditions of a rotation speed of 2,000 rpm and a stirring time of 1 hour to obtain a raw material mixture. The various solid raw materials were mixed at a proportion by which hexagonal ferrite having such a composition that the value of x in Formula 1 was a value shown in Table 1 was obtained.

Next, the obtained raw material mixture was subjected to a pulverization treatment for 60 seconds by using Wonder Crusher WC-3, manufactured by OSAKA CHEMICAL Co., Ltd., as a cutter mill pulverizer, and setting the variable speed dial of this pulverizer to "3", whereby pulverized materials were obtained. The obtained pulverized materials were placed in a muffle furnace, and the temperature inside the furnace was set to 1,200° C. in an ambient air atmosphere, followed by sintering for 4 hours, whereby magnetic powders 1 to 3, 6, and 7 were obtained.

[Preparation of Magnetic Powder 4]

A magnetic powder 4 was obtained in the same manner as in the preparation of the magnetic powder 1 except that strontium carbonate was changed to barium carbonate [$BaCO_3$] and the various solid raw materials were mixed at a proportion by which hexagonal ferrite having such a composition that the value of x was a value shown in Table 1.

[Checking of Crystal Structure]

The crystal structure of the magnetic material that constitutes each of the above magnetic powders was checked by the analysis according to the X-ray diffraction method. As the measurement device, X'Pert Pro manufactured by PANalytical Co., Ltd., which is an X-ray diffractometer, was used. The measurement conditions are shown below.

(Measurement Conditions)

X-ray source: CuK$\alpha$ ray
[Wavelength: 1.54 Å (0.154 nm), output: 40 mA, 45 kV]
Scan range: 20 degrees<2$\theta$<70 degrees
Scan interval: 0.05 degrees
Scan speed: 0.75 degrees/min As a result of the X-ray diffraction analysis, it was confirmed that the magnetic powders 1 to 4, 6, and 7 have a magnetoplumbite-type crystal structure and are a single-phase powder of a magnetoplumbite-type hexagonal ferrite that does not include $\alpha$ crystal structure other than the magnetoplumbite-type crystal structure.

[Checking of Composition]

The composition of the magnetic material that constitutes each of the above magnetic powders was checked by high frequency inductively coupled plasma emission spectroscopy. Specifically, the checking was carried out by the following method.

A container (a beaker) containing 12 mg of the magnetic powder and 10 mL of an aqueous solution of hydrochloric acid of a concentration of 4 mol/L was held on a hot plate at a set temperature of 120° C. for 3 hours to obtain a dissolution solution. 30 mL of pure water was added to the obtained dissolution solution, which is then filtered using a membrane filter having a filter pore diameter of 0.1 μm. Elemental analysis of the filtrate obtained as described above was carried out using a high frequency inductively coupled plasma emission spectrometer [ICPS-8100, manufactured by Shimadzu Corporation]. Based on the obtained elemental analysis results, the content of each atom with respect to 100% by atom of the iron atom was determined. Then, based on the obtained content, the composition of the magnetic material was checked. As a result, it was confirmed that the compositions of the magnetic powders 1 to 3, 6, and 7 are such that A in Formula 1 is Sr, where the compositions are such that x is the value shown in Table 1, and that the composition of the magnetic powder 4 is such that A in Formula 1 is Ba, where the composition is such that x is the value shown in Table 1.

[Preparation and Evaluation of Magnetic Powder 5]

<Preparation of Magnetic Powder 5 (Powder of ε-Iron Oxide)>

As a magnetic powder 5, a powder of an ε-iron oxide was prepared by the following method.

4.0 g of an aqueous ammonia solution of a concentration of 25% by mass was added to a mixture obtained by dissolving 8.6 g of iron (III) nitrate nonahydrate, 0.69 g of gallium nitrate (III) octahydrate, and 1.5 g of polyvinylpyrrolidone (PVP) in 90.0 g of pure water, while stirring using a magnetic stirrer, in an ambient air atmosphere and under the condition of an ambient temperature of 25° C., and stirred under the condition of an ambient temperature of 25° C. as it was for 2 hours. To the obtained solution, an aqueous citric acid solution obtained by dissolving 1 g of citric acid in 9 g of pure water was added and stirred for 1 hour. The powder precipitated after stirring was collected by centrifugation, washed with pure water, and dried in a heating furnace having a furnace temperature of 80° C.

800 g of pure water was added to the dried powder, and the powder was dispersed again in water to obtain a dispersion liquid. The obtained dispersion liquid was heated to a liquid temperature of 50° C., and 40 g of an aqueous ammonia solution of a concentration of 25% by mass was added dropwise thereto while stirring. After stirring for 1 hour while maintaining the temperature of 50° C., 14 mL of tetraethoxysilane (TEOS) was added dropwise thereto, and the mixture was stirred for 24 hours. 50.0 g of ammonium sulfate was added to the obtained reaction solution, and the precipitated powder was collected by centrifugation, washed with pure water, and dried in a heating furnace having a furnace temperature of 80° C. for 24 hours, whereby a precursor of an ε-iron oxide, on which silicon-containing coating film was formed, was obtained.

The obtained precursor was charged into a heating furnace having a furnace temperature of 1,000° C. in an ambient air atmosphere and subjected to heat treatment for 4 hours.

The powder obtained after the heat treatment was put into a 4 mol/L aqueous solution of sodium hydroxide (NaOH), and stirring was carried out while maintaining the temperature at 70° C. for 24 hours, to carry out a coating film removing treatment.

Then, the powder subjected to the coating film removing treatment was collected by a centrifugation treatment and washed with pure water to obtain a magnetic powder 5.

<Checking of Crystal Structure>

The crystal structure of the magnetic material that constitutes the magnetic powder 5 was checked by the analysis according to the X-ray diffraction method. Here, the powder X-ray diffractometer used for the checking of the crystal structures of the magnetic powders 1 to 4 was used, and the same measurement conditions as the measurement conditions for the checking of the crystal structures of the magnetic powders 1 to 4 were employed. As a result of the X-ray diffraction analysis, it was confirmed that the magnetic powder 5 has a single-phase crystal structure of the ε-phase (an ε-iron oxide-type crystal structure) that does not include crystal structures of the α-phase and the γ-phase.

[Aliphatic Polyamide]

In Table 1, "PA6" described in the column of "Aliphatic polyamide" is nylon 6 (which is obtained by mixing nylon 6 manufactured by UNITIKA Ltd (model number: A1030SR) and nylon 6 manufactured by UNITIKA Ltd (model number: A1030GFL45) at a mass ratio of the former: the latter=56:44) so that the glass fiber content is 20% by mass.

"PA12" is nylon 12 (UBESTA manufactured by UBE Corporation/model number: 3024GC6).

"PA11" is nylon 11 (Rilsan (registered trade name) BBZM300 (Bk) TL manufactured by Arkema S.A.).

"PA66" is nylon 66 (CM1011G-15 manufactured by Toray Industries, Inc.).

Example 1

The magnetic powder shown in Table 1 was introduced into a kneader (Labo Plastomill manufactured by Toyo Seiki Seisaku-sho, Ltd.) together with the aliphatic polyamide shown in Table 1 and an antioxidant (ADEKA STAB AO-60 manufactured by ADEKA Corporation), and kneading was carried out at a set temperature of the kneader was of 220° C. to obtain a composition for forming a radio wave absorber (an aggregated kneaded material). The using amounts of the magnetic powder and the aliphatic polyamide were such amounts that the volume filling rate of the magnetic powder in the prepared radio wave absorber was 30% by volume and the volume filling rate of the aliphatic polyamide was 70% by volume. The antioxidant was used at a proportion of 1 part by mass with respect to 100 parts by mass of the aliphatic polyamide.

The obtained composition for forming a radio wave absorber was subjected to press molding (heat pressing) using a heating press machine at a set temperature of the heating press machine of 240° C. to obtain a plate-shaped molded product having a square plane having a side length of 100 mm. This molded product was taken out from the heating press machine after the heat pressing, immediately immersed in water (water temperature: 20° C.), and allowed to stand as it was in the water for 1 hour.

In this way, a radio wave absorber (a radio wave absorbing sheet) of Example 1 was obtained.

Example 2

The molded product after the heat pressing was allowed to stand in a room temperature environment (ambient temperature: 25° C.) for 1 hour without being immersed in water.

A radio wave absorber (a radio wave absorbing sheet) of Example 2 was obtained in the same manner as in Example 1 except for the above.

Example 3

The molded product after the heat pressing was allowed to stand in an environment having an ambient temperature of 40° C. for 1 hour without being immersed in water.

A radio wave absorber (a radio wave absorbing sheet) of Example 3 was obtained in the same manner as in Example 1 except for the above.

Example 4

The molded product after the heat pressing was allowed to stand in an environment having an ambient temperature of 80° C. for 1 hour without being immersed in water.

A radio wave absorber (a radio wave absorbing sheet) of Example 4 was obtained in the same manner as in Example 1 except for the above.

Examples 6, 8, and 10

Each of radio wave absorbers (radio wave absorbing sheets) of Examples 6, 8, and 10 was obtained in the same manner as in Example 4 except that the aliphatic polyamide shown in Table 1 was used.

Examples 5, 7, 9, and 11 to 16

Each of radio wave absorbers (radio wave absorbing sheets) of Examples 5, 7, 9, and 11 to 16 was obtained in the same manner as in Example 1 except that the magnetic powder or the aliphatic polyamide was changed to that shown in Table 1.

Comparative Example 1

After heat pressing, the power of the heating press machine was turned off, and the molded product was allowed to stand in the heating press machine in a state of being pressed in the heating press machine. Twelve hours after the power was turned off, the molded product was taken out from the heating press machine.

A radio wave absorber (a radio wave absorbing sheet) of Comparative Example 1 was obtained in the same manner as in Example 1 except for the above.

Comparative Examples 2 to 4

Each of radio wave absorbers (radio wave absorbing sheets) of Comparative Examples 2 to 4 was obtained in the same manner as in Comparative Example 1 except that the aliphatic polyamide was changed to that shown in Table 1.

For each of the radio wave absorbers in Examples and Comparative Examples, the thickness was determined as the arithmetic mean of the measured values measured at nine points which were randomly selected, using a digital length measuring machine [Litematic (registered trade name) VL-50A manufactured by Mitutoyo Corporation]. All the thicknesses of the above radio wave absorbers were 2 mm.

Regarding each of Examples and Comparative Examples, two radio wave absorbers were prepared, one was used for measuring the intensity ratio ($\alpha/\gamma$), and the other one was used for measuring the absorption peak frequency of transmission attenuation.

[Measurement of Intensity Ratio ($\alpha/\gamma$)]

A measurement sample having an area of 40 mm×40 mm (thickness: 2 mm) was cut out from each of the radio wave absorbers (the radio wave absorbing sheets) of Examples and Comparative Examples.

The cut-out sample was subjected to measurement using an X-ray diffractometer (SmartLab manufactured by Rigaku Corporation) under the conditions described above, and from the diffraction pattern of the X-ray diffraction spectrum obtained by 2θ/ω scanning, the intensity at 2θ=20.1 (degree) was determined as the diffraction intensity α of the α crystal of an aliphatic polyamide, and the intensity at 2θ=21.4 (degree) was determined as the diffraction intensity γ of the γ crystal of the aliphatic polyamide. The ratio ($\alpha/\gamma$) of α to γ determined in this way was calculated, and this ratio was defined as the intensity ratio ($\alpha/\gamma$).

[Measurement of Absorption Peak Frequency (A) of Transmission Attenuation]

The frequency at which the absorption peak of transmission attenuation of each of the above-described radio wave absorbers is present was measured according to the following method. Here, the absorption peak frequency of transmission attenuation means a frequency at which the transmission attenuation amount is the maximum value in the sweep frequency band.

Examples 1 to 10 and 14 to 16 and Comparative Examples 1 to 4

As measurement devices, a vector network analyzer (product name: N5225B) manufactured by Keysight Technologies and a horn antenna (product name: RH12S23, RH06S10) manufactured by KEYCOM Corp. were used to measure an S parameter every 0.1 GHz according to a free space method by setting an incidence angle to 0° and a sweep frequency band to 55.0 GHz to 95.0 GHz and 110.0 GHz to 170.0 GHz, with one plane of each of the above radio wave absorbers being directed toward the incident side, and then S21 of the S parameter was taken as the transmission attenuation amount, and the frequency at which the transmission attenuation amount is the maximum value in the sweep frequency band was taken as the absorption peak frequency of transmission attenuation.

Examples 11 to 13

The S parameter was measured in the same manner as described above, and S21 of the S parameter was taken as the transmission attenuation amount, and the frequency at which the transmission attenuation amount is the maximum value in the sweep frequency band was taken as the absorption peak frequency of transmission attenuation except that a horn antenna (product name: RH28S23APC2.9 (f) 7, RH15S10) manufactured by KEYCOM Corp. was used and the sweep frequency band was set to 26.5 GHz to 40.0 GHz and 50.0 GHz to 75.0 GHz.

[Measurement of Standard Value (B) of Absorption Peak Frequency of Transmission Attenuation]

A reference sample showing a standard value of the absorption peak frequency for comparison with the radio wave absorbers of Examples and Comparative Examples, containing the magnetic powder 1, was prepared according to the following method.

A composition for forming a radio wave absorber was obtained in the same manner as in Example 1 except that an olefin-based elastomer (MILASTOMER manufactured by Mitsui Chemicals, Inc./model number: 9070NS) was used instead of the aliphatic polyamide shown in Table 1 and that the set temperature of the kneader was set to 200° C.

The obtained composition for forming a radio wave absorber was subjected to press molding (heat pressing) using a heating press machine at a set temperature of the heating press machine of 200° C. to obtain a plate-shaped molded product having a square plane having a side length of 100 mm. This molded product was taken out from the heating press machine after the heat pressing and allowed to stand in a room temperature environment (ambient temperature: 25° C.) for 1 hour without being immersed in water.

A radio wave absorber (a reference sample) was obtained in the same manner as in Example 1 except for the above.

The reference sample obtained in this way was subjected to measurement in the same manner as the measurement of the absorption peak frequency (A) of the radio wave absorber to be compared, and the frequency at which the transmission attenuation amount is the maximum value in the sweep frequency band was taken as the absorption peak frequency (the standard value) of transmission attenuation of the reference sample.

Each reference sample showing a standard value of the absorption peak frequency for comparison with the radio wave absorbers of Examples, containing the magnetic powders 2 to 7, was prepared in the same manner as described above except that the magnetic powder 1 was changed to any of the magnetic powders 2 to 7.

The reference sample obtained in this way was subjected to measurement in the same manner as the measurement of the absorption peak frequency (A) of the radio wave absorber to be compared, and the frequency at which the transmission attenuation amount is the maximum value in the sweep frequency band was taken as the absorption peak frequency (the standard value) of transmission attenuation of the reference sample.

It is noted that, when confirmed by the inventors of the present invention, in a plurality of samples (radio wave absorbers) obtained by changing only the cooling conditions after molding (heat pressing), no change was observed in the position of the absorption peak of transmission attenuation in a case where the olefin-based elastomer was used as the binder.

For each of the radio wave absorbers of Examples and Comparative Examples, a frequency difference was calculated as "(absorption peak frequency of transmission attenuation of radio wave absorber)−(absorption peak frequency of transmission attenuation of reference sample)". It can be said that the smaller the value of the frequency difference calculated in this way is, the more the occurrence of the deviation in the position of the absorption peak of transmission attenuation is suppressed in the radio wave absorber containing a magnetic powder and an aliphatic polyamide.

From the calculated frequency difference values, the suppression level of the occurrence of the deviation in the position of the absorption peak of transmission attenuation was subjected to the overall evaluation according to the following evaluation standards.

A: Frequency difference is 0 GHz or more and 0.5 GHz or less.

B: Frequency difference is more than 0.5 GHz and 1.5 GHz or less.

C: Frequency difference is more than 1.5 GHz and 2.3 GHz or less.

D: Frequency difference exceeds 2.3 GHz.

The above results are shown in Table 1.

TABLE 1

| | Magnetic powder | | | | Intensity ratio ($\alpha/\gamma$) | Radio wave absorption performance | | | |
|---|---|---|---|---|---|---|---|---|---|
| | Kind | A in Formula 1 | x in Formula 1 | Aliphatic polyamide | | (A) Absorption peak frequency (GHz) | (B) Absorption peak frequency standard value (GHz) | Frequency difference (A) − (B) (GHz) | Overall evaluation |
| Example 1 | Magnetic powder 1 | Sr | 1.7 | PA6 | 0.31 | 76.5 | 76.5 | 0 | A |
| Example 2 | Magnetic powder 1 | Sr | 1.7 | PA6 | 1.50 | 77.1 | 76.5 | 0.6 | B |
| Example 3 | Magnetic powder 1 | Sr | 1.7 | PA6 | 2.12 | 77.4 | 76.5 | 0.9 | B |
| Example 4 | Magnetic powder 1 | Sr | 1.7 | PA6 | 2.59 | 78.5 | 76.5 | 2.0 | C |
| Example 5 | Magnetic powder 1 | Sr | 1.7 | PA12 | 0.15 | 76.6 | 76.5 | 0.1 | A |
| Example 6 | Magnetic powder 1 | Sr | 1.7 | PA12 | 2.51 | 78.4 | 76.5 | 1.9 | C |
| Example 7 | Magnetic powder 1 | Sr | 1.7 | PA11 | 0.17 | 76.6 | 76.5 | 0.1 | A |
| Example 8 | Magnetic powder 1 | Sr | 1.7 | PA11 | 2.56 | 78.5 | 76.5 | 2.0 | C |
| Example 9 | Magnetic powder 1 | Sr | 1.7 | PA66 | 0.14 | 76.6 | 76.5 | 0.1 | A |
| Example 10 | Magnetic powder 1 | Sr | 1.7 | PA66 | 2.53 | 78.4 | 76.5 | 1.9 | C |
| Example 11 | Magnetic powder 2 | Sr | 1.0 | PA6 | 0.22 | 60.4 | 60.3 | 0.1 | A |
| Example 12 | Magnetic powder 3 | Sr | 0.5 | PA6 | 0.27 | 50.1 | 50.0 | 0.1 | A |
| Example 13 | Magnetic powder 4 | Ba | 1.0 | PA6 | 0.35 | 40.0 | 39.5 | 0.5 | A |
| Example 14 | Magnetic powder 5 | n-iron oxide | | PA6 | 0.31 | 125.5 | 125.0 | 0.5 | A |
| Example 15 | Magnetic powder 6 | Sr | 4.8 | PA6 | 0.30 | 140.4 | 140.0 | 0.4 | A |
| Example 16 | Magnetic powder 7 | Sr | 1.7 | PA6 | 0.50 | 76.8 | 76.5 | 0.3 | A |
| Comparative Example 1 | Magnetic powder 1 | Sr | 1.7 | PA6 | 2.90 | 79.0 | 76.5 | 2.5 | D |
| Comparative Example 2 | Magnetic powder 1 | Sr | 1.7 | PA12 | 2.80 | 79.3 | 76.5 | 2.8 | D |
| Comparative Example 3 | Magnetic powder 1 | Sr | 1.7 | PA11 | 2.90 | 79.5 | 76.5 | 3.0 | D |
| Comparative Example 4 | Magnetic powder 1 | Sr | 1.7 | PA66 | 2.90 | 79.2 | 76.5 | 2.7 | D |

The radio wave absorbers of Examples 1 to 16 and Comparative Examples 1 to 4 described above are all radio wave absorbers containing a magnetic powder and an aliphatic polyamide.

From the results shown in Table 1, it can be confirmed that the radio wave absorbers of Examples 1 to 16 suppress the occurrence of the deviation in the position of the absorption peak of transmission attenuation as compared with the radio wave absorbers of Comparative Examples 1 to 4.

[Preparation of Magnetic Powder 8]

The magnetic powder 1 produced by the method described above was subjected to a phosphate compound treatment and a silane coupling agent treatment as surface treatments to obtain a surface-treated magnetic powder (a magnetic powder 8).

Each of the magnetic powder 1 (100 parts by mass), phosphoric acid (0.5 parts by mass), and isopropanol (2.5 parts by mass) was weighed and mixed for 1 minute using a bottle blender (manufactured by WARING, model number: 7011HBC). Then, the obtained mixture was heated and dried in a heating device having an internal ambient temperature of 95° C. for 2 hours. In this way, a magnetic powder treated with the phosphoric acid compound was obtained.

Subsequently, each of 3-aminopropyltriethoxysilane (0.5 parts by mass), isopropanol (2.5 parts by mass), and pure water (0.1 parts by mass) was weighed and mixed for 1 minute with the magnetic powder treated with the phosphoric acid compound obtained above, a bottle blender (manufactured by WARING, model number: 7011HBC). Then, the obtained mixture was heat-treated in a heating device having an internal ambient temperature of 120° C. for 2 hours.

In this way, a magnetic powder 8 was obtained.

Example 17

A radio wave absorber (a radio wave absorbing sheet) of Example 17 was obtained in the same manner as in Example 1 except that the magnetic powder was changed to the magnetic powder 8.

Regarding the obtained radio wave absorber, as a result of carrying out the measurement of the intensity ratio (α/γ) and the radio wave absorption performance according to the same measurement method as in the measurement for the radio wave absorber of Example 1, the results were same as the results obtained from the radio wave absorber of Example 1.

One aspect of the present invention is useful in the technology field of carrying out various automatic driving controls such as automatic driving control of an automobile, and the wireless technology field such as a motion sensor field.

What is claimed is:
1. A radio wave absorber comprising:
a magnetic powder; and
an aliphatic polyamide,
wherein an intensity ratio, α/γ, of a diffraction intensity α of an α crystal of the aliphatic polyamide to a diffraction intensity γ of a γ crystal of the aliphatic polyamide, which are determined by subjecting the radio wave absorber to measurement with an X-ray diffraction method, is 2.60 or less.
2. The radio wave absorber according to claim 1, wherein the magnetic powder includes a powder of a hexagonal ferrite.
3. The radio wave absorber according to claim 2, wherein the hexagonal ferrite has a composition represented by Formula 1,

$$AFe_{(12-x)}Al_xO_{19} \qquad \text{Formula 1}$$

in Formula 1, A represents one or more kinds of atoms selected from the group consisting of Sr, Ba, Ca, and Pb, and x satisfies 0.50≤x≤8.00.
4. The radio wave absorber according to claim 3, wherein in Formula 1, an atom represented by A includes Sr.
5. The radio wave absorber according to claim 3, wherein in Formula 1, x satisfies 1.50≤x≤8.00.
6. The radio wave absorber according to claim 5, wherein in Formula 1, an atom represented by A includes Sr.
7. The radio wave absorber according to claim 3, wherein in Formula 1, x satisfies 0.50≤x<1.50.
8. The radio wave absorber according to claim 7, wherein in Formula 1, an atom represented by A includes Sr.
9. The radio wave absorber according to claim 1, wherein the magnetic powder includes a powder of an ε-iron oxide.
10. The radio wave absorber according to claim 9, wherein the ε-iron oxide is an ε-iron oxide containing one or more kinds of atoms selected from the group consisting of an aluminum atom, a gallium atom, an indium atom, a titanium atom, and a cobalt atom.
11. The radio wave absorber according to claim 1, wherein the intensity ratio is 2.20 or less.
12. The radio wave absorber according to claim 1, wherein the aliphatic polyamide includes one or more kinds of aliphatic polyamides selected from the group consisting of nylon 6, nylon 11, nylon 12, and nylon 66.
13. A radio wave absorbing article comprising the radio wave absorber according to claim 1.
14. The radio wave absorbing article according to claim 13, wherein the magnetic powder includes a powder of a hexagonal ferrite.
15. The radio wave absorbing article according to claim 14, wherein the hexagonal ferrite has a composition represented by Formula 1, $$AFe_{(12-x)}Al_xO_{19} \qquad \text{Formula 1}$$

in Formula 1, A represents one or more kinds of atoms selected from the group consisting of Sr, Ba, Ca, and Pb, and x satisfies 0.50≤x≤8.00.
16. The radio wave absorbing article according to claim 15, wherein in Formula 1, an atom represented by A includes Sr.
17. The radio wave absorbing article according to claim 13, wherein the magnetic powder includes a powder of an ε-iron oxide.
18. The radio wave absorbing article according to claim 17, wherein the ε-iron oxide is an ε-iron oxide containing one or more kinds of atoms selected from the group consisting of an aluminum atom, a gallium atom, an indium atom, a titanium atom, and a cobalt atom.
19. The radio wave absorbing article according to claim 13, wherein the intensity ratio is 2.20 or less.
20. The radio wave absorbing article according to claim 13, wherein the aliphatic polyamide includes one or more kinds of aliphatic polyamides selected from the group consisting of nylon 6, nylon 11, nylon 12, and nylon 66.

* * * * *